US007781283B2

(12) United States Patent
Anderson et al.

(10) Patent No.: US 7,781,283 B2
(45) Date of Patent: Aug. 24, 2010

(54) SPLIT-GATE DRAM WITH MUGFET, DESIGN STRUCTURE, AND METHOD OF MANUFACTURE

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 187 days.

(21) Appl. No.: 12/192,537

(22) Filed: Aug. 15, 2008

(65) Prior Publication Data

US 2010/0041191 A1 Feb. 18, 2010

(51) Int. Cl.
*H01L 21/8242* (2006.01)

(52) U.S. Cl. ....................... 438/239; 438/157; 438/164; 257/297; 257/350; 257/E21.623; 257/E21.646; 257/E27.085

(58) Field of Classification Search ................. 438/157, 438/164, 239; 257/297, 350, E21.623, E21.646, 257/E27.085
See application file for complete search history.

(56) References Cited

U.S. PATENT DOCUMENTS 6,580,137 B2 6/2003 Parke
6,759,282 B2 * 7/2004 Campbell et al. ........... 438/149
6,888,199 B2 5/2005 Nowak et al.
6,977,404 B2 12/2005 Katsumata et al.
6,980,457 B1 12/2005 Horch et al.
7,037,790 B2 5/2006 Chang et al.
7,049,654 B2 5/2006 Chang
7,105,390 B2 9/2006 Brask et al.
7,120,046 B1 10/2006 Forbes
7,183,164 B2 2/2007 Haller
7,193,279 B2 3/2007 Doyle et al.
7,199,419 B2 4/2007 Haller
7,208,373 B2 4/2007 Weis
7,224,020 B2 5/2007 Wang et al.
7,229,895 B2 6/2007 Wells
7,241,653 B2 7/2007 Hareland et al.
7,247,570 B2 7/2007 Thomas
7,253,493 B2 8/2007 Wang et al.
7,268,058 B2 9/2007 Chau et al.
7,279,375 B2 10/2007 Radosavljevic et al.
7,285,812 B2 10/2007 Tang et al.
7,348,225 B2 3/2008 Zhu
7,348,642 B2 3/2008 Nowak
7,564,084 B2 * 7/2009 Song et al. .................. 257/296
2004/0157396 A1 * 8/2004 Lee et al. .................... 438/283
2004/0208049 A1 * 10/2004 Walker ....................... 365/149

* cited by examiner

*Primary Examiner*—Mary Wilczewski
*Assistant Examiner*—Toniae M Thomas
(74) *Attorney, Agent, or Firm*—Anthony J. Canale; Roberts Mlotkowski Safran & Cole, P.C.

(57) ABSTRACT

A method of manufacturing a dynamic random access memory cell includes: forming a substrate having an insulating region over a conductive region; forming a fin of a fin-type field effect transistor (FinFET) device over the insulating region; forming a storage capacitor at a first end of the fin; and forming a back-gate at a lateral side of the fin. The back-gate is in electrical contact with the conductive region and is structured and arranged to influence a threshold voltage of the fin.

20 Claims, 26 Drawing Sheets

65
75
60
55
70
80
85

60
65
75
55
70
80
85

55
60
55
65
170
55
60
55
65
170

SPLIT-GATE DRAM WITH MUGFET, DESIGN STRUCTURE, AND METHOD OF MANUFACTURE

CROSS-REFERENCE TO RELATED APPLICATIONS

This application is related to U.S. Ser. No. 12/192,554 filed on the same day and currently pending.

FIELD OF THE INVENTION

The invention relates to semiconductor devices used for memory applications, and more particularly, to a design structure, structure, and method for providing a split-gate DRAM with MuGFET.

BACKGROUND

DRAM (Dynamic Random Access Memory) is desirable over SRAM (Static Random Access Memory) in many situations because DRAM arrays can be denser and DRAM devices require less power to operate. As semiconductor device sizes continue to decrease (for example, toward the 22 nanometer node, and smaller), single gate devices begin to experience performance degradation, such as short channel effects. Accordingly, there is a trend toward using multiple gate field effect transistor devices (e.g., MuGFET). Some conventional DRAM devices employ a planar transistor with a gate beneath the channel and a word line above the channel. However, these arrangements exhibit relatively low performance and can only be arranged in low-density arrays.

A challenge facing DRAM improvement is the reduction of operating power even lower than what it is currently employed. This is at least partly due to the phenomenon of leakage. For example, when threshold voltage of a fin-type field effect transistor (FinFET) DRAM device is reduced too far, leakage becomes a significant concern. The threshold voltage of FinFET retards leakage of stored charge out of the capacitance structure of the DRAM. Leakage increases as threshold voltage decreases, thereby requiring more frequent updating of the capacitance structure of the DRAM.

However, it is desirable in some circumstances to have a low threshold voltage, because a lower threshold voltage permits a lower wordline voltage to be utilized with the DRAM device. Put another way, when the threshold voltage is kept high to prevent undesirable leakage, the wordline voltage during write and read operations must also be high to overcome the threshold voltage. Since the wordline voltage is directly related to the operating power required to drive a DRAM device, leakage is generally in conflict with lowering the operating power.

Accordingly, there exists a need in the art to overcome the deficiencies and limitations described hereinabove.

SUMMARY

In a first aspect of the invention, there is a method of manufacturing a dynamic random access memory cell. The method comprises: forming a substrate having an insulating region over a conductive region; forming a fin of a fin-type field effect transistor (FinFET) device over the insulating region; forming a storage capacitor at a first end of the fin; and forming a back-gate at a lateral side of the fin. The back-gate is in electrical contact with the conductive region and is structured and arranged to influence a threshold voltage of the fin.

In a second aspect of the invention, there is a method of manufacturing a dynamic random access memory cell, the method comprising: forming a doped region within a substrate; forming a conductive layer over the doped region; forming an insulating layer over the conductive layer; and forming a fin over the insulating region. The method further includes: forming a storage capacitor connected to a first end of the fin; forming a bit line contact connected to a second end of the fin opposite the first end; forming a back-gate at a first lateral side of the fin between the first end and the second end, wherein the back-gate is in electrical contact with the conductive layer; and forming a front gate at a second lateral side of the fin opposite the first lateral side.

In a third aspect of the invention, there is a method of forming an array of dynamic random access memory cells, the method comprising forming a plurality of fins over a conductive region of a substrate. For each one of the plurality of fins, the method includes forming: a storage capacitor connected to a first longitudinal end of the fin; a back-gate adjacent at a first lateral side of the fin, wherein the back-gate is in electrical contact with the conductive region; and a front gate at a second lateral side of the fin opposite the first lateral side.

In a fourth aspect of the invention, there is a method of forming an array of dynamic random access memory cells. The method comprises: forming, in a substrate, a doped region having a first type of dopant; forming, in the substrate and over the doped region, a conductive region having a second type of dopant opposite the first type of dopant; and forming a plurality of fin-type field effect transistor (FinFET) devices. Each one of the plurality of FinFET devices comprises: a fin formed over the conductive region of a substrate; a storage capacitor connected to a longitudinal end of the fin; a back-gate adjacent at a first lateral side of the fin, wherein the back-gate is in electrical contact with the conductive region; and a front gate at a second lateral side of the fin opposite the first lateral side.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor devices used for memory applications, and more particularly, to a design structure, structure, and method for providing a split-gate DRAM with MuGFET. In embodiments of the invention, a DRAM device comprises a FinFET having a wordline on a first lateral side of a vertical fin and a back-gate on an opposite lateral side of the fin. According to aspects of the invention, the back-gate is connected at its base to a conducting layer of the substrate, thereby placing the back-gate at substantially the same electrical potential as the conducting layer. In this manner, the threshold voltage of the fin may be controlled by controlling the electrical potential of the conducting layer. Moreover, multiple back-gates of multiple DRAM devices in an array may be connected to the same conducting layer, thereby providing simultaneous control of the array of DRAM devices.

In embodiments of the invention, the DRAM device operates in at least two modes. In a first mode (e.g., standby mode), the back-gate is biased relatively negative (e.g., to about −1.0 v), which results in a high threshold voltage in the fin, which reduces subthreshold channel leakage. The bias of the back-gate is provided via the conducting layer of the substrate. In a second mode of operation (e.g., read/write mode, also referred to as access mode), the back-gate is biased to a relatively positive level (e.g., about 0 to +1.0 v), which lowers the threshold voltage in the fin, which reduces the amount of voltage required on the wordline to read from or write to the storage structure (e.g., capacitor) of the DRAM, and hence reduces the required power for a read or a write operation.

In this manner, embodiments of the invention include a DRAM device that operates at relatively low power while reducing the effect of leakage. Moreover, by using a vertical fin and split gates with the back-gate electrically connected to a conducting layer of the substrate, implementations of the invention provide this low-power DRAM device in dense arrays.

Figure 1:
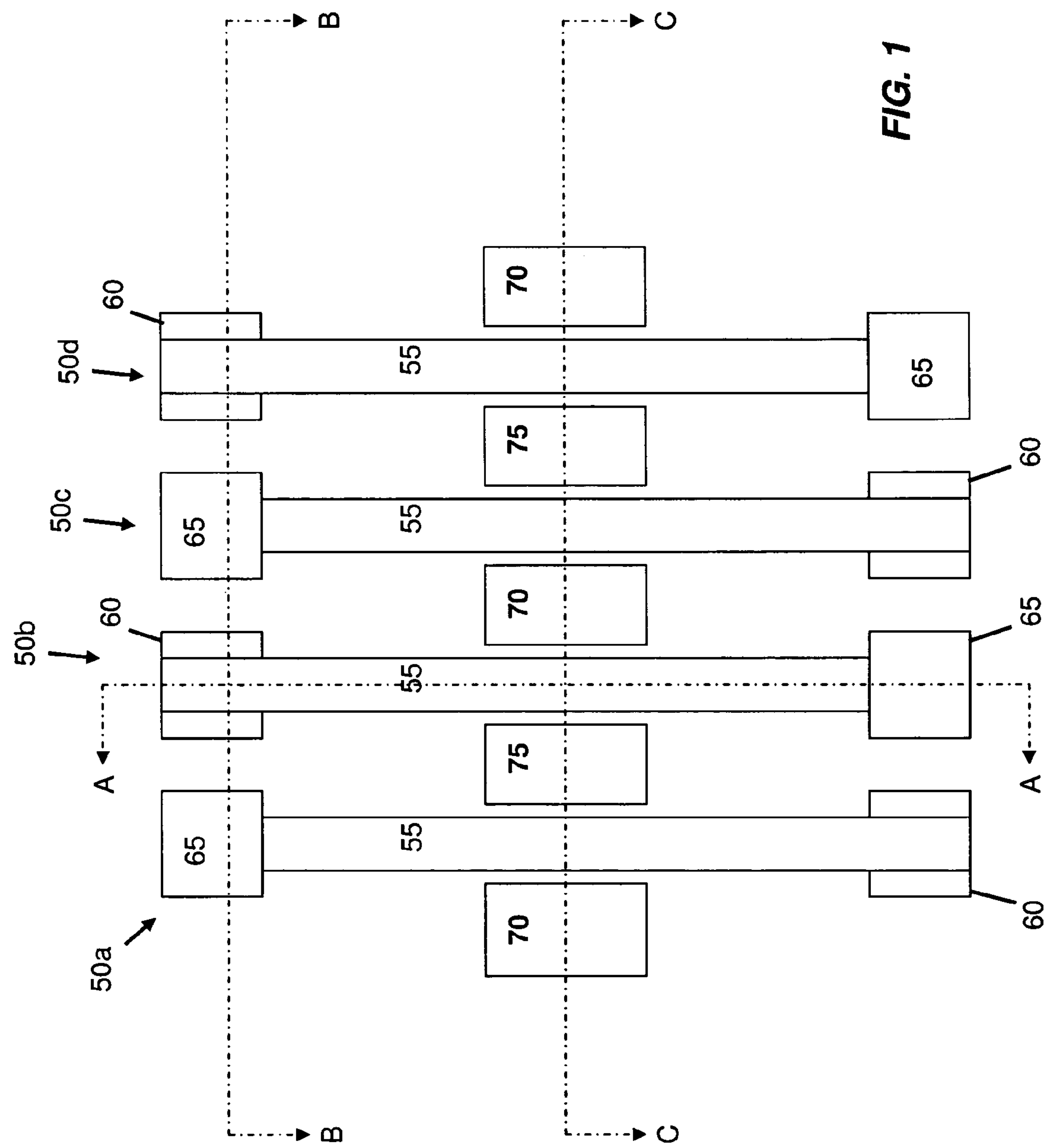
FIG. 1 shows a cross-sectional plan view of portions of an interleaved array of DRAM devices according to aspects of the invention.

FIG. 1 shows a cross-sectional plan view of portions of an interleaved array of DRAM devices according to aspects of the invention. Each respective device 50*a-d* is a FinFET device comprising a fin 55, storage capacitor 60, and bit line contact 65. In embodiments, back-gates 70 and word lines 75 are arranged laterally to the sides of the fins 55. In embodiments, the array is interleaved such that the storage capacitor 60 of one device (e.g., 50*a*) is in the place of the bit line contact 65 of an adjacent device (e.g., 50*b*), and vice versa.

Figure 2:
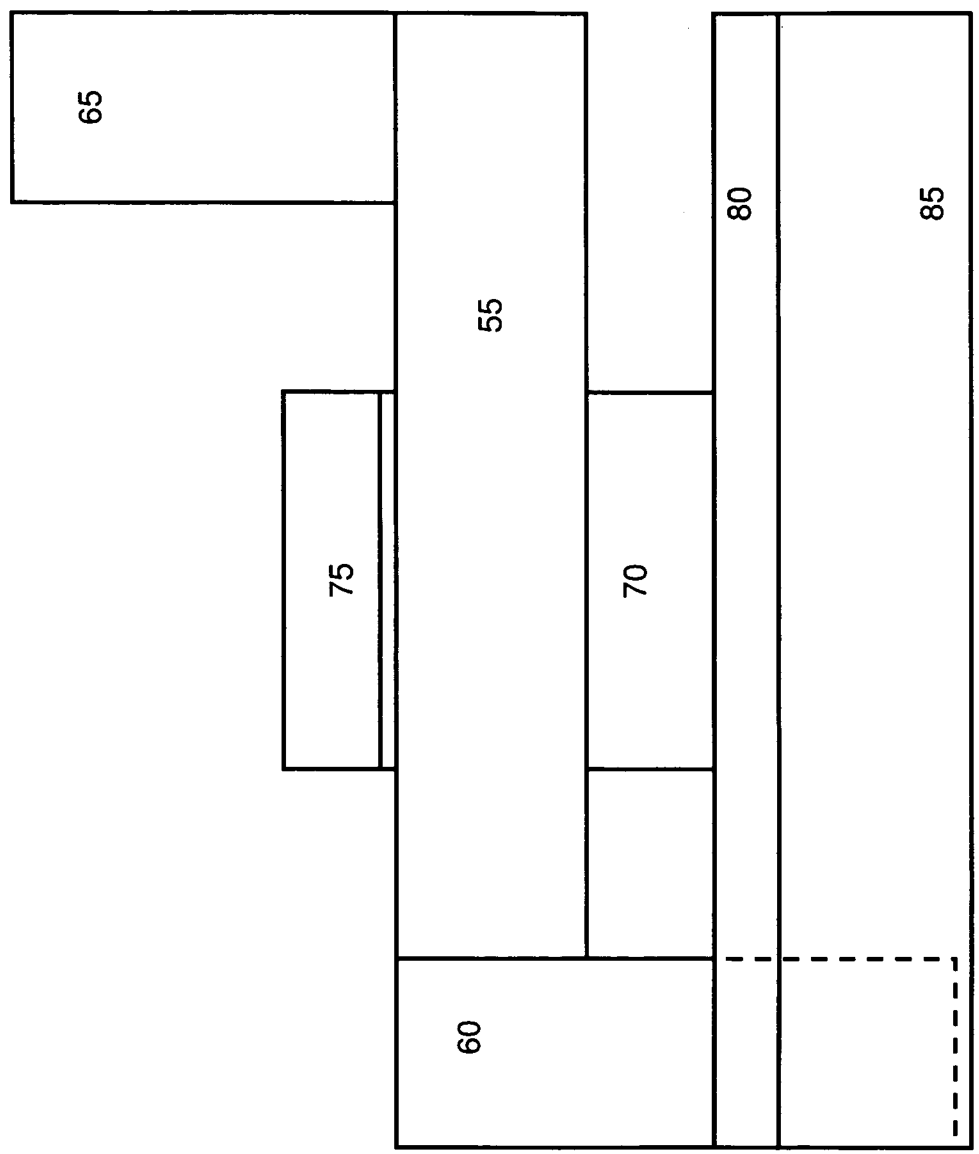
FIG. 2 shows a cross-sectional view taken along line A-A of FIG. 1.

FIG. 2 shows a cross-sectional view taken along line A-A of FIG. 1. As seen in FIG. 2, the back-gate 70 extends downward from one lateral side of the fin 55. At its base, the back-gate 70 is in contact with a conductive layer 80, which is formed on a top surface of a doped region 85 that is formed within the substrate (not shown). In embodiments, the conductive layer 80 is a P+ type layer, the doped region 85 is an N-type region, and the substrate is a P-type silicon material substrate. Alternatively, the conductive layer 80 may be an N+ layer, the doped region 85 may be a P-type region, and the substrate may be an N-type silicon material substrate. As further depicted in FIG. 2, the bit line contact 65 extends upward from the fin 55, and the capacitor 60 extends downward from the fin 55 into the conductive layer 80 and the doped region 85.

According to aspects of the invention, by connecting the back-gate 70 to the conducting layer 80, the electrical bias in the fin 55 may be controlled by selectively manipulating the electrical potential of the conducting layer 80. Moreover, by connecting the respective back-gates 70 of plural devices (e.g., 50*a-d*) to the same conducting layer 80, the plural devices (e.g., 50*a-d*) can be biased between standby mode and read/write mode as a group. The interface between the conducting layer 80 and the doped region 85 ensures that there is little or no conductivity between the conducting layer 80 and the doped region 85. This allows the conducting layer 80 to be utilized as a wiring layer for any back-gate 70 connected to the conducting layer 80.

Figure 3:
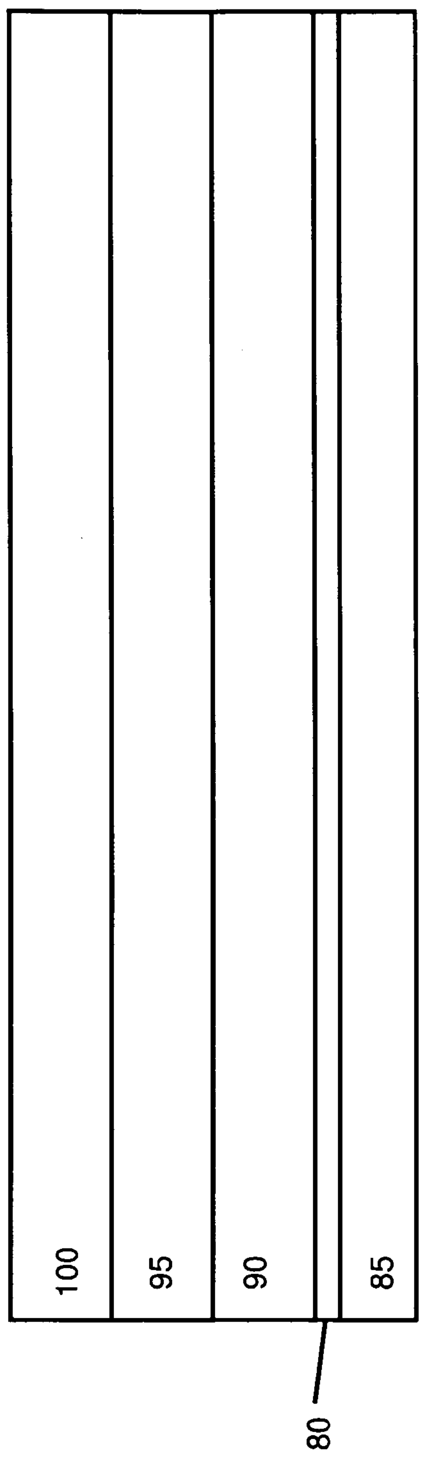
FIGS. 3-29 show fabrication processes and respective structures for manufacturing a structure in accordance with aspects of the invention.

FIGS. 3-29 show fabrication processes and respective structures for manufacturing a structure in accordance with the present invention. FIG. 3 shows a beginning structure for forming devices according to aspects of the invention. As depicted in FIG. 3, the conducting layer 80 is formed on a top surface of the doped region 85. The doped region 85 may, in turn, be formed as a doped region within a substrate. In embodiments, the conducting layer 80 is a P-type region that is formed by ion implantation to a concentration of about $1\times10^{18}$ atoms/$cm^3$ to about $1\times10^{21}$ atoms/$cm^3$, although the invention is not limited to these concentrations and other concentrations may be used.

Formed on a top surface of the conducting layer 80 is an insulator 90, such as a buried oxide (BOX). Formed on a top surface of the BOX 90 is an active silicon region 95. Formed on a top surface of the active silicon 95 are pad films 100, which may comprise, for example, an $SiO_2$ layer formed on the active silicon 95 and an $Si_3N_4$ layer formed on the $SiO_2$ layer. All of the layers described thus far (e.g., 80, 85, 90, 95, 100) may be formed using conventional semiconductor processing techniques.

Figure 4:
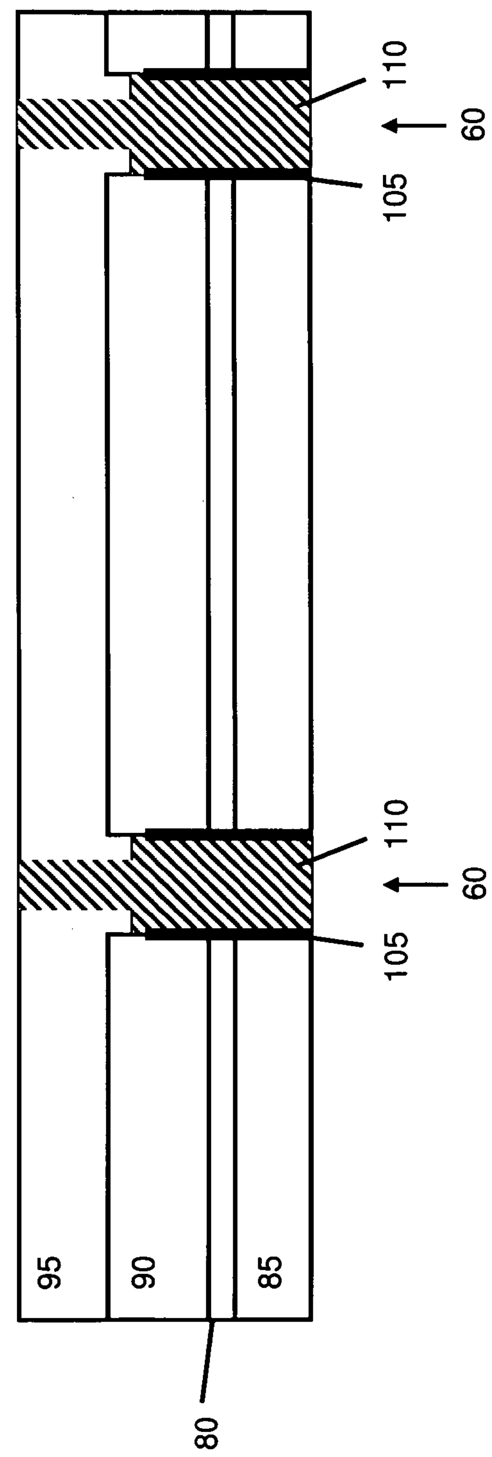

FIG. 4 shows the structure of FIG. 3 after a number of intermediate processing steps, and corresponds to a cross section along line B-B of FIG. 1. As depicted in FIG. 4, capacitors 60 have been formed in the layers 80, 85, 90, and 95. A trench capacitor dielectric 105 surrounds a trench conductor 110 in each capacitor 60. The trench capacitor dielectric 105 may be composed of, for example, an oxynitride, high-k dielectric, etc. In embodiments, when the trench capacitor dielectric 105 is an oxynitride, the trench conductor 110 may be formed of doped polysilicon. Alternatively, when the trench capacitor dielectric 105 is a high-k dielectric, the trench conductor 110 may be formed of a titanium nitride liner surrounding aluminum or doped polysilicon. However, the invention is not limited to these materials, and any suitable materials may be used for the trench capacitor dielectric 105 and the trench conductor 110.

The intermediate process steps for forming the structure of FIG. 4 may include, for example: forming a trench in the pad films 100 (e.g., using conventional patterning and etching, such as photolithography and reactive ion etching (RIE)), forming a corresponding trench in the layers 80, 85, 90, and 95 (e.g., using RIE); depositing the trench capacitor dielectric 105 (e.g., using chemical vapor deposition (CVD), atomic layer deposition (ALD), etc.); form filling the trench the trench conductor 110; planarizing the top surface of the structure (e.g., using chemical mechanical polish (CMO); etching the trench conductor 110 down to a level within the BOX layer 95 (e.g., below the active silicon 95); etching back the pad films away from the trench; removing any trench dielectric exposed by the etching of the trench conductor 110 (e.g., using wet etch, isotropic etch, etc.); growing, optionally selectively, silicon to fill in open portions of the trench between the trench conductor 110 and the active silicon 95;

and stripping the remaining pad films 100 (e.g., using selective RIE, then a wet or dry etch).

Figure 5:
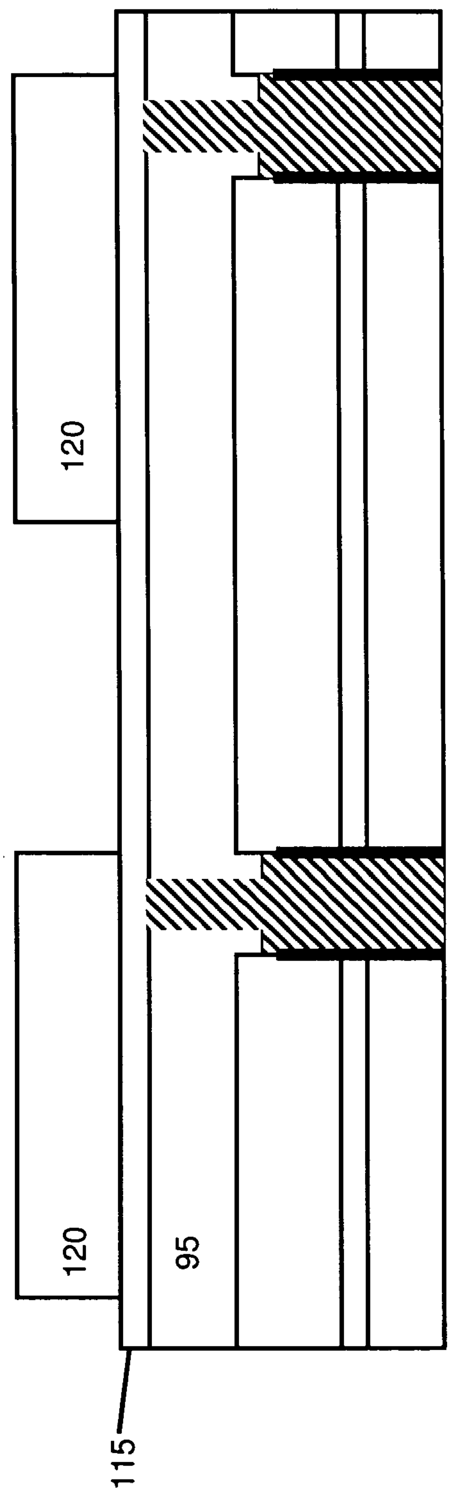
Figure 6:
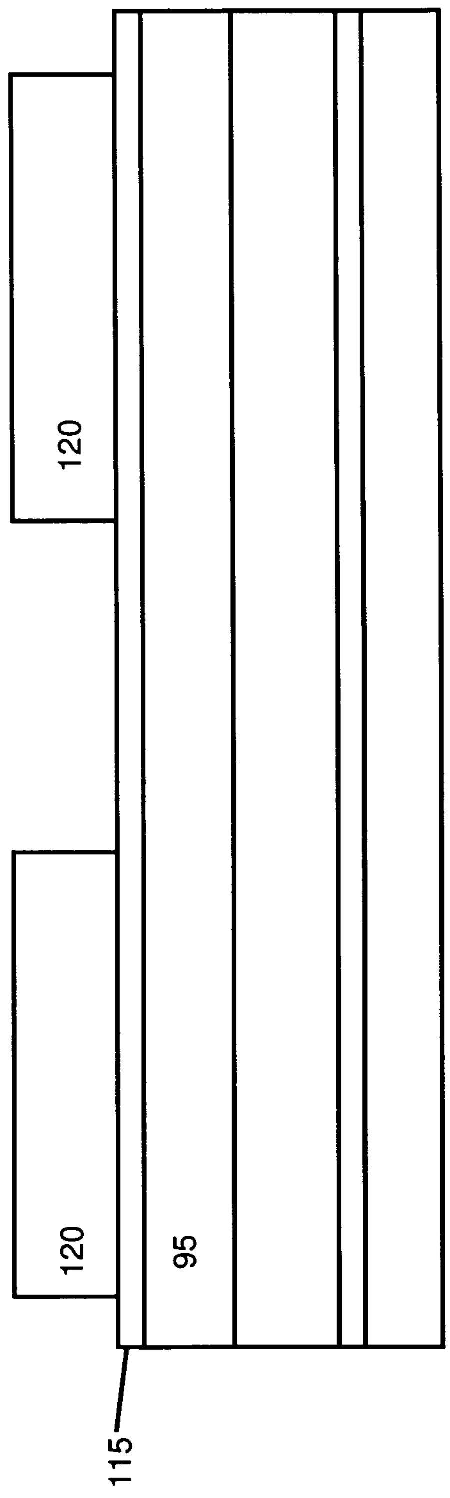

FIGS. 5 and 6 show intermediate structures shown along lines B-B and C-C of FIG. 1, respectively, during concurrent process steps according to aspects of the invention. For example, FIG. 5 shows the cross section along line B-B, which represents the region where the capacitors 60 and bit line contacts 65 are formed. FIG. 6 shows the cross section along line C-C, which represents the region where the gates (e.g., the back-gate 70 and word line 75) are formed.

Figure 7:
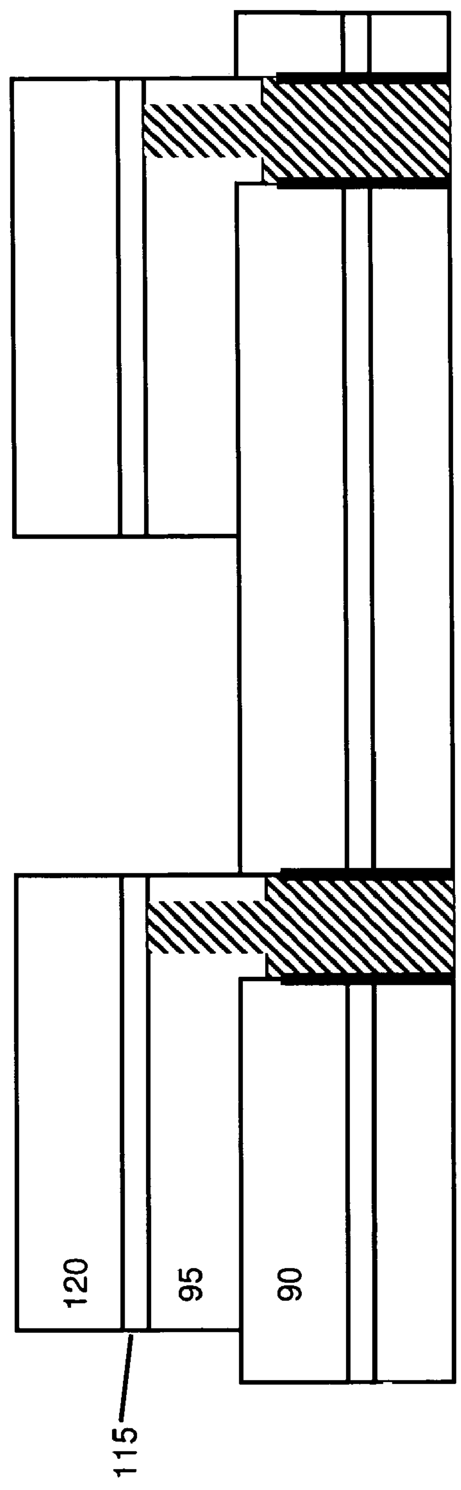
Figure 8:
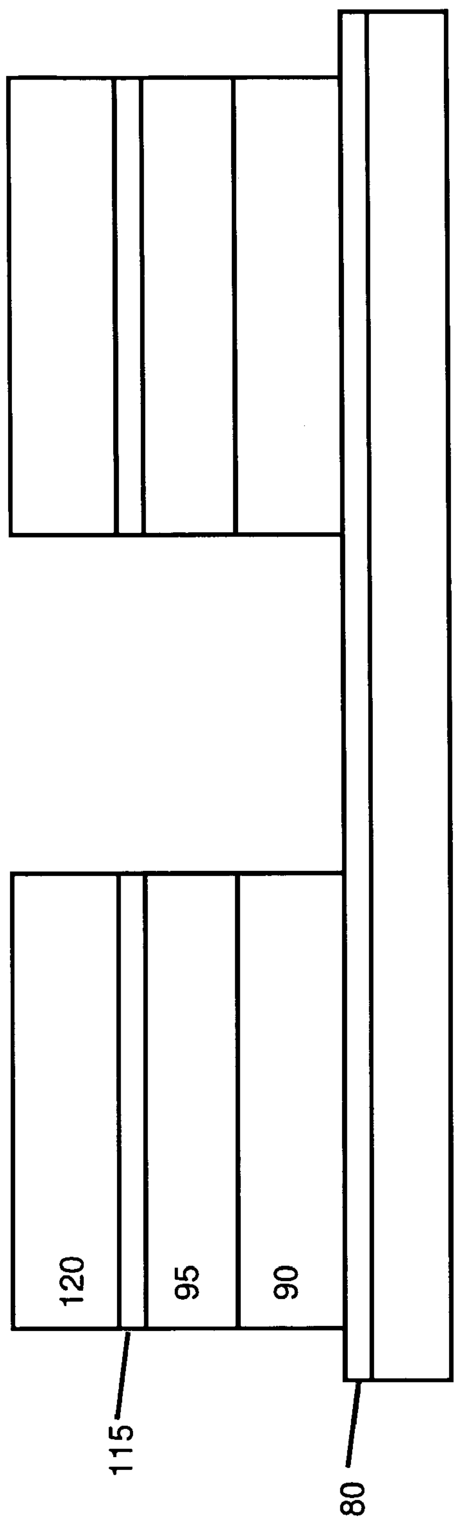

As depicted in FIGS. 5 and 6, a second pad film 115 is formed on a top surface of the active silicon 95, and a mandrel 120 is formed on a top surface of the second pad film 115. The second pad film 115 and mandrel 120 may be any suitable materials, and may be formed using conventional deposition techniques. The pad film may comprise, for example, oxide, nitride, or a combination of the both. The mandrel may be composed of, but is not limited to, silicon dioxide, or a polyimide FIGS. 7 and 8 show concurrent intermediate structures along lines B-B and C-C of FIG. 1, respectively. As depicted in FIG. 7, portions of the second pad film 115 and active silicon 95 are etched to expose the BOX 90. Similarly, in FIG. 8, portions of the second pad film 115, the active silicon 95, and the BOX 90 are etched to expose the conductive layer 80. The etching may be performed using conventional etching techniques, such as photolithographic masking and RIE.

Figure 9:
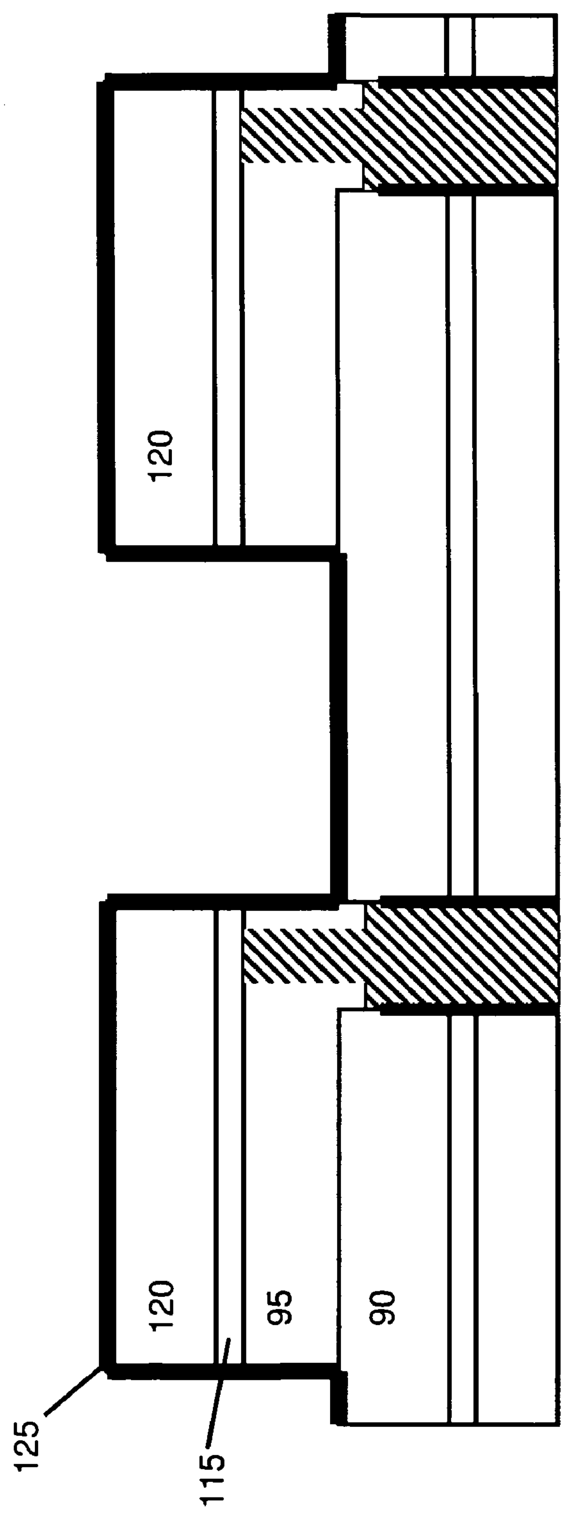
Figure 10:
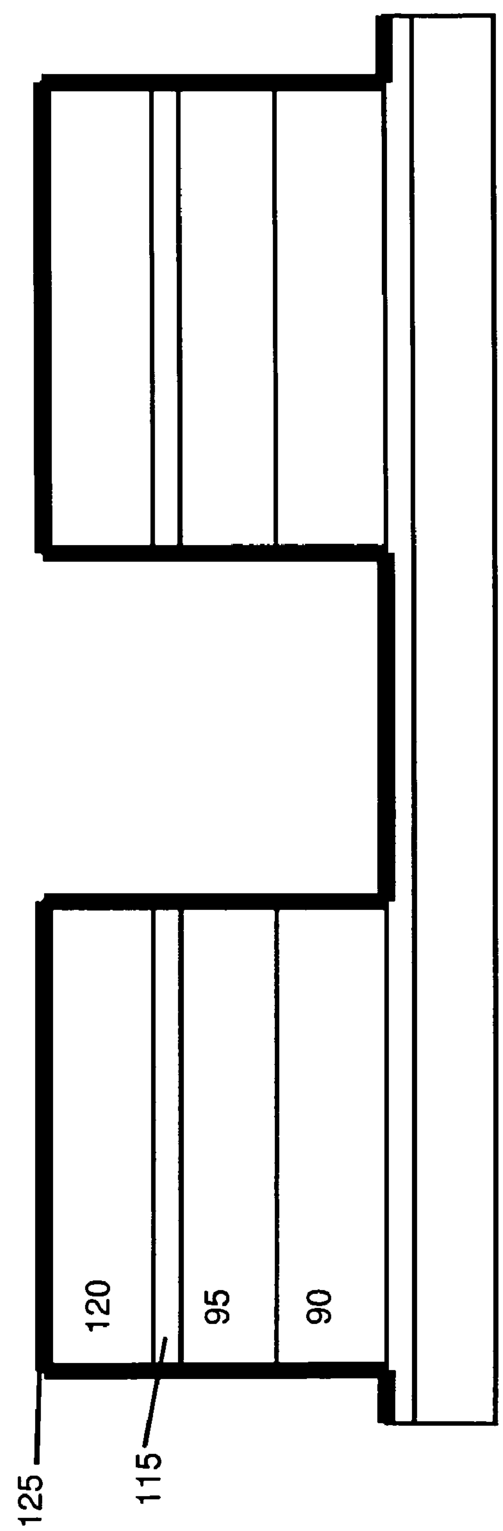

FIGS. 9 and 10 show concurrent intermediate structures along lines B-B and C-C of FIG. 1, respectively. As depicted in FIGS. 9 and 10, back-gate dielectric 125 is formed on all exposed surfaces (e.g., of layers 90, 95, 115 and 120 in FIG. 9, and layers 80, 90, 95, 115, and 120 in FIG. 10). The back-gate dielectric 125 may be composed of any suitable substance, including, but not limited to, hafnium oxide, hafnium silicate, etc. The back-gate dielectric 125 may be formed by known techniques (e.g., deposition, thermal oxidation, etc.).

Figure 11:
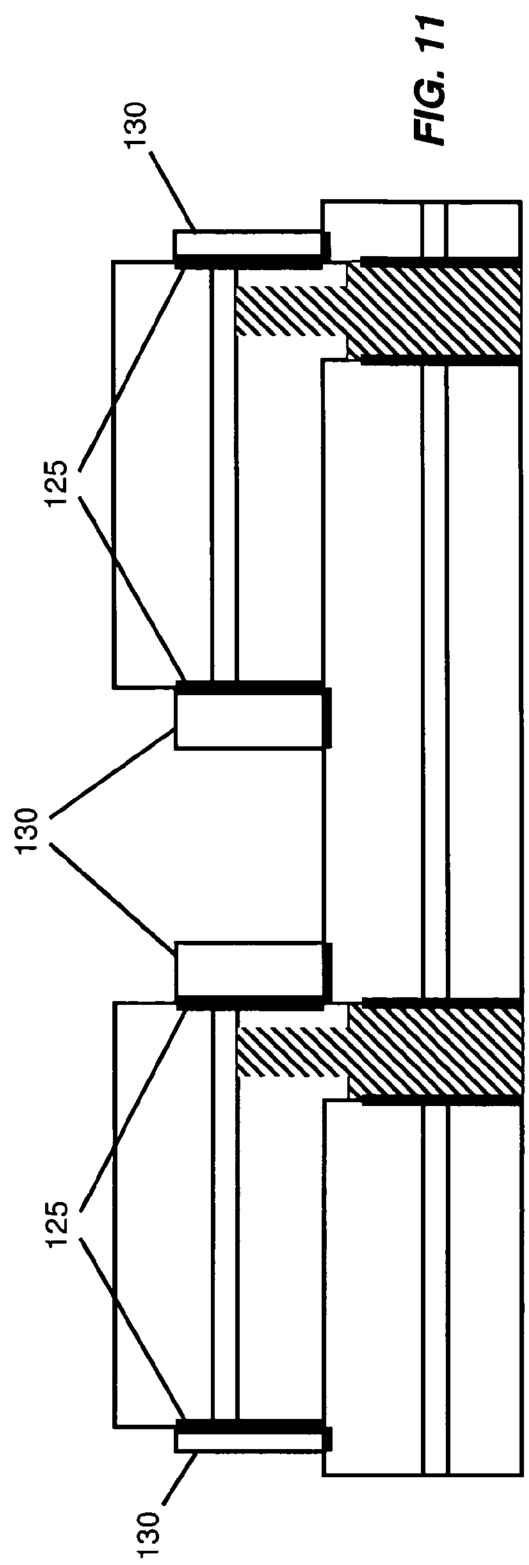
Figure 12:
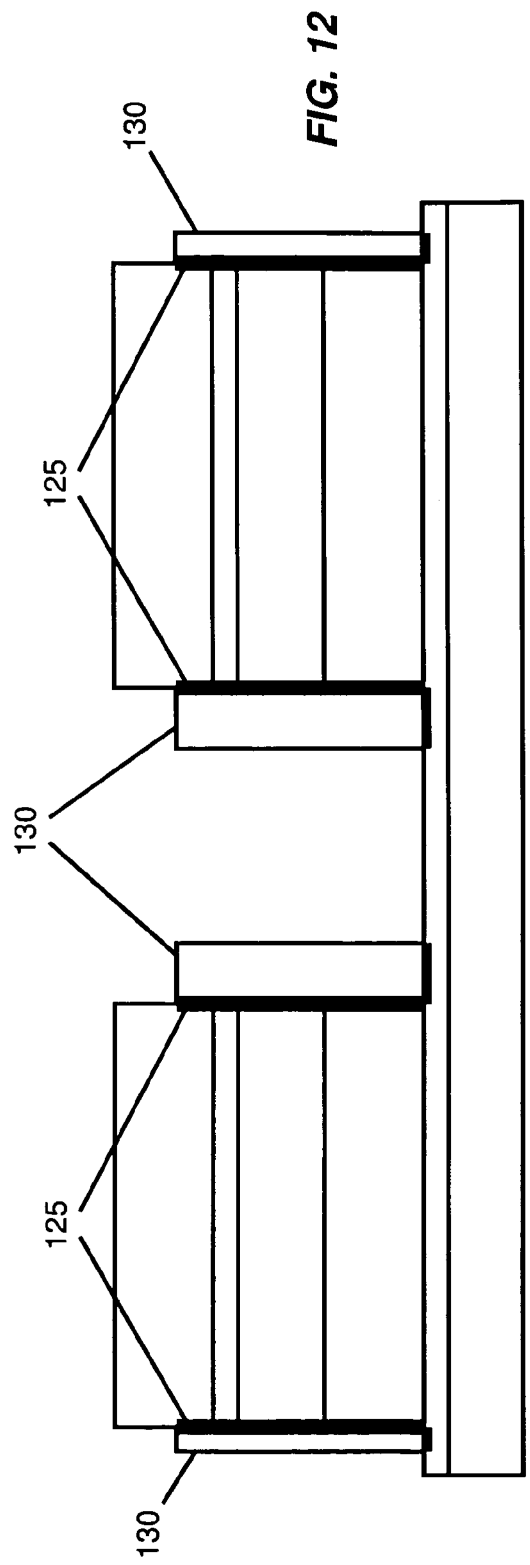

FIGS. 11 and 12 show concurrent intermediate structures along lines B-B and C-C of FIG. 1, respectively. In embodiments, back-gate electrode material 130 is conformally deposited and anisotropically etched to form sidewall gates. Then, exposed back-gate dielectric 125 is removed via etching. In embodiments, the back-gate electrode material 130 comprises, but it not limited to, a titanium nitride and tungsten composite.

Figure 13:
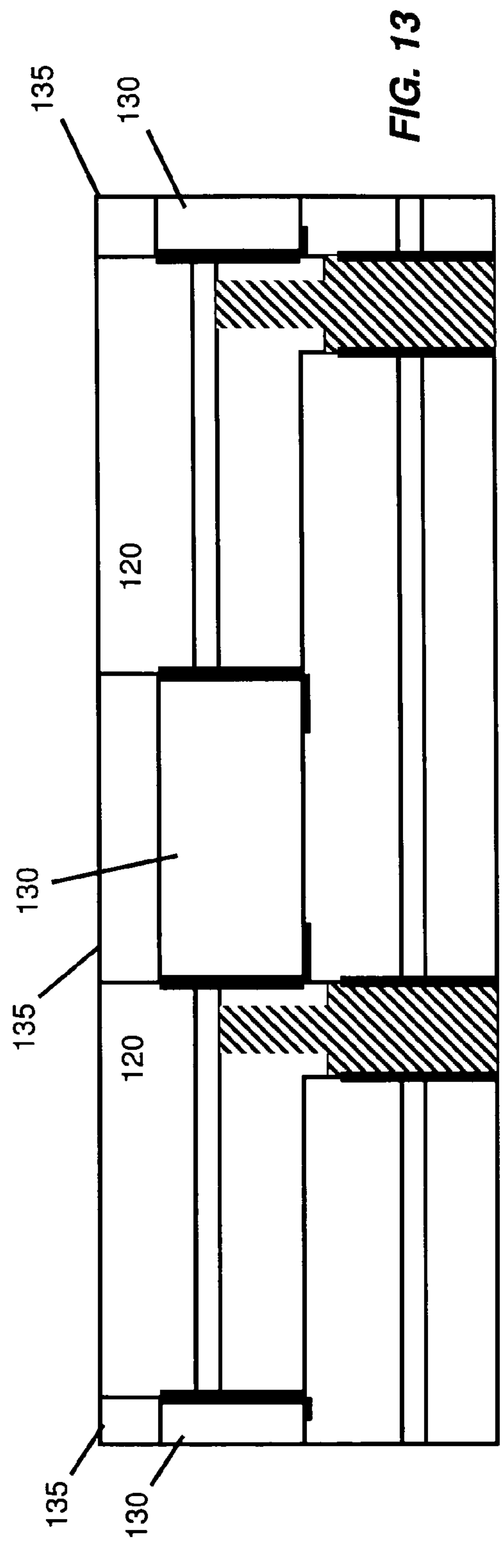
Figure 14:
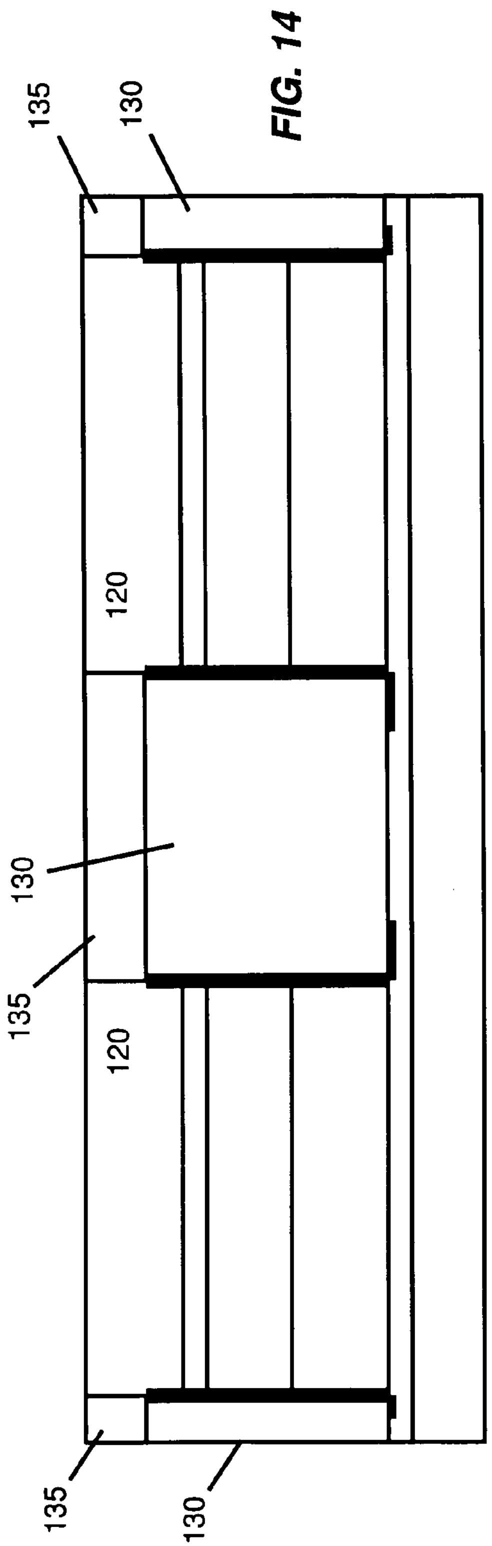

FIGS. 13 and 14 show concurrent intermediate structures along lines B-B and C-C of FIG. 1, respectively. In embodiments, more of the same back-gate electrode material 130 described above with respect to FIGS. 11 and 12 is added to fill recesses adjacent the sidewall gates. Then, an insulator 135 (e.g., $SiO_2$) is formed above the sidewall gates adjacent the mandrels 120. Surfaces may be planarized between steps.

Figure 15:
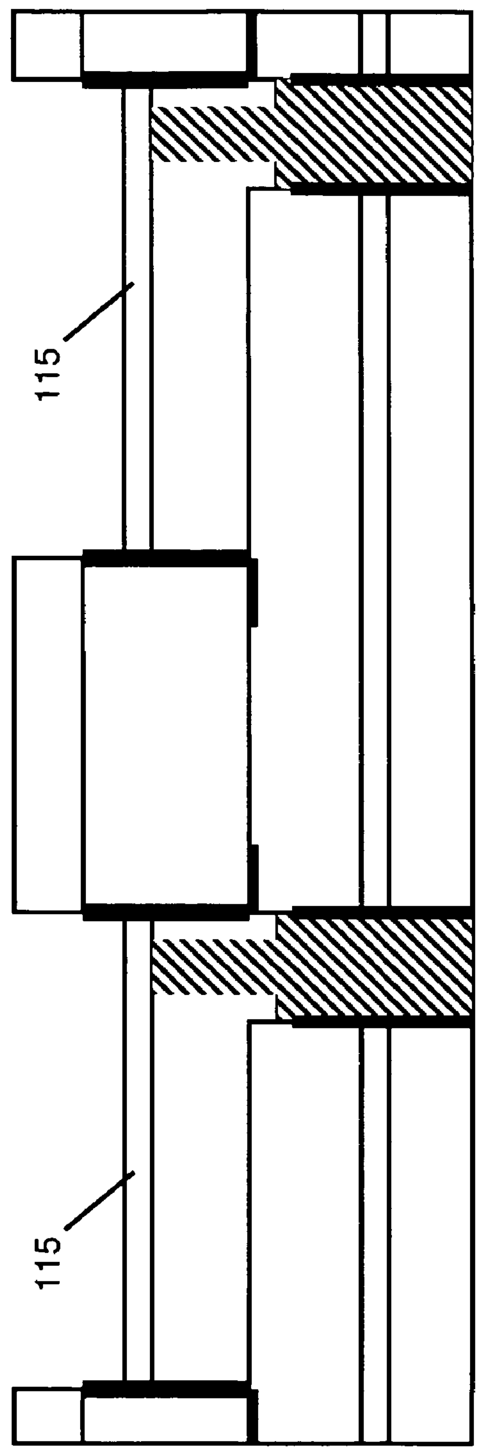
Figure 16:
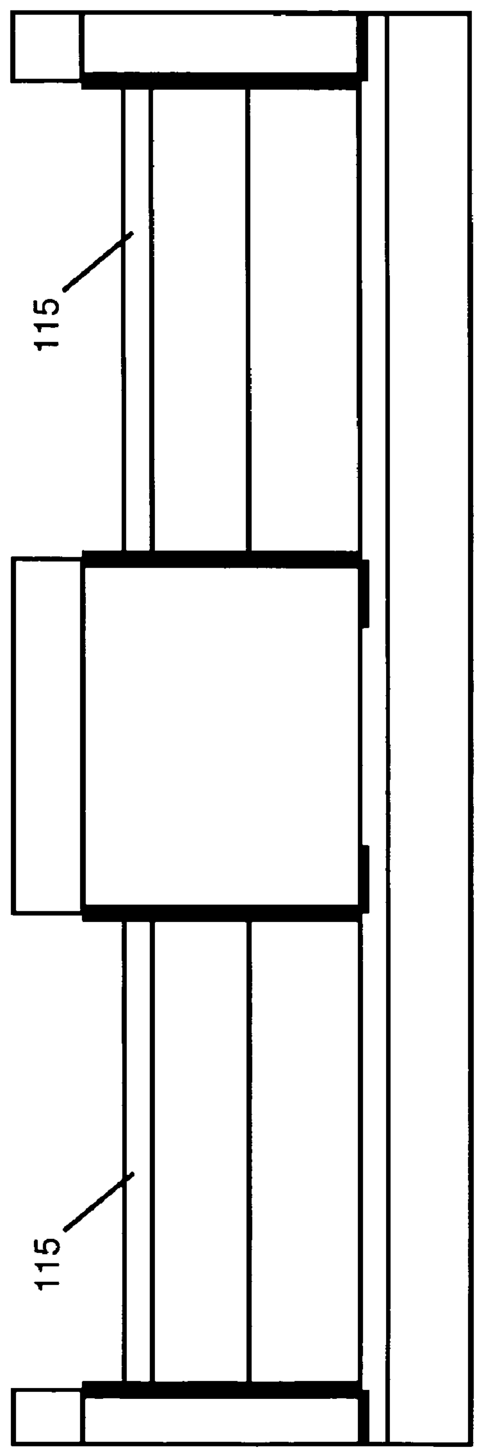
Figure 17:
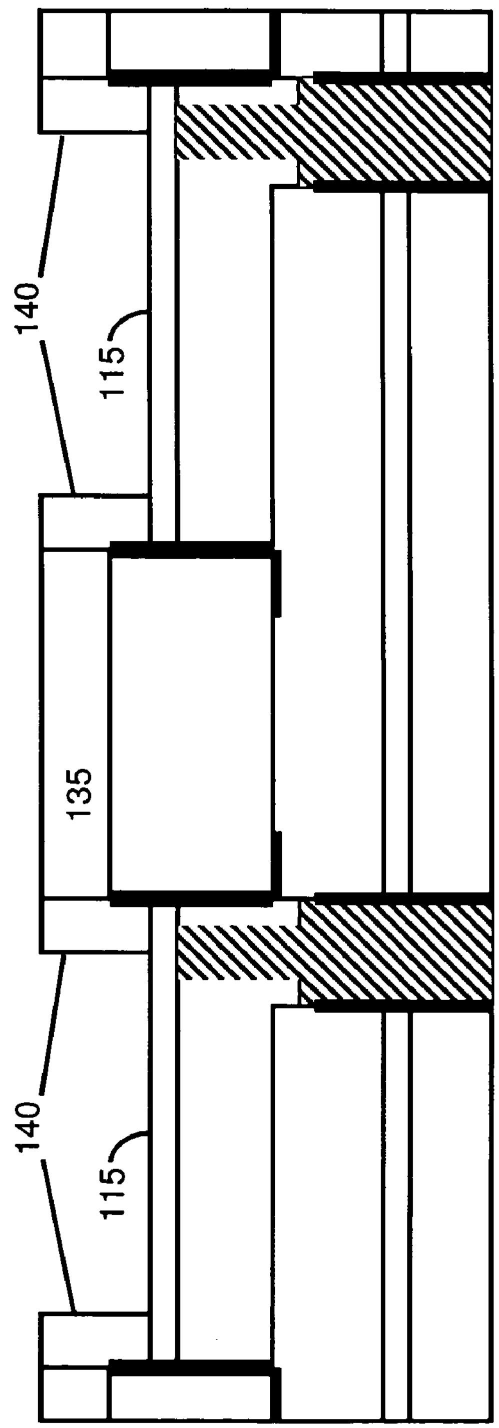
Figure 18:
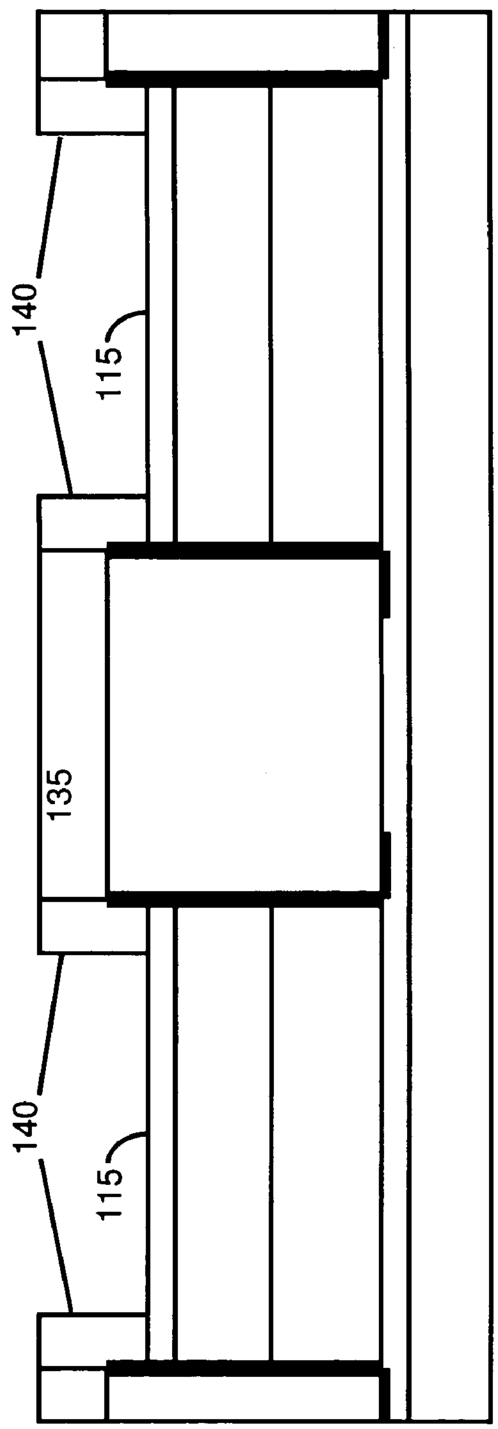

As depicted in FIGS. 15 and 16, which show concurrent intermediate structures along lines B-B and C-C of FIG. 1, respectively, the mandrel is removed to expose portions of the second pad film 115. The mandrel may be removed using RIE. As depicted in FIGS. 17 and 18, which show concurrent intermediate structures along lines B-B and C-C of FIG. 1, respectively, spacers 140 are formed on the second pad film 115 and adjacent the insulator 135. The spacers 140 may be nitride, for example formed using a nitride deposition followed by a directional etch.

Figure 19:
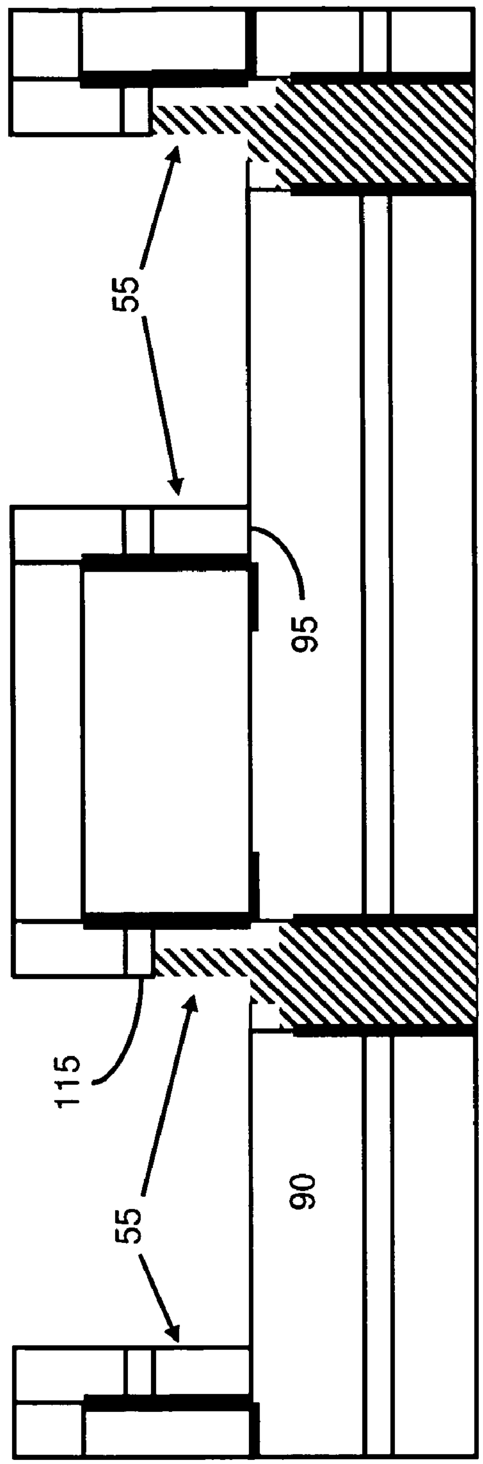
Figure 20:
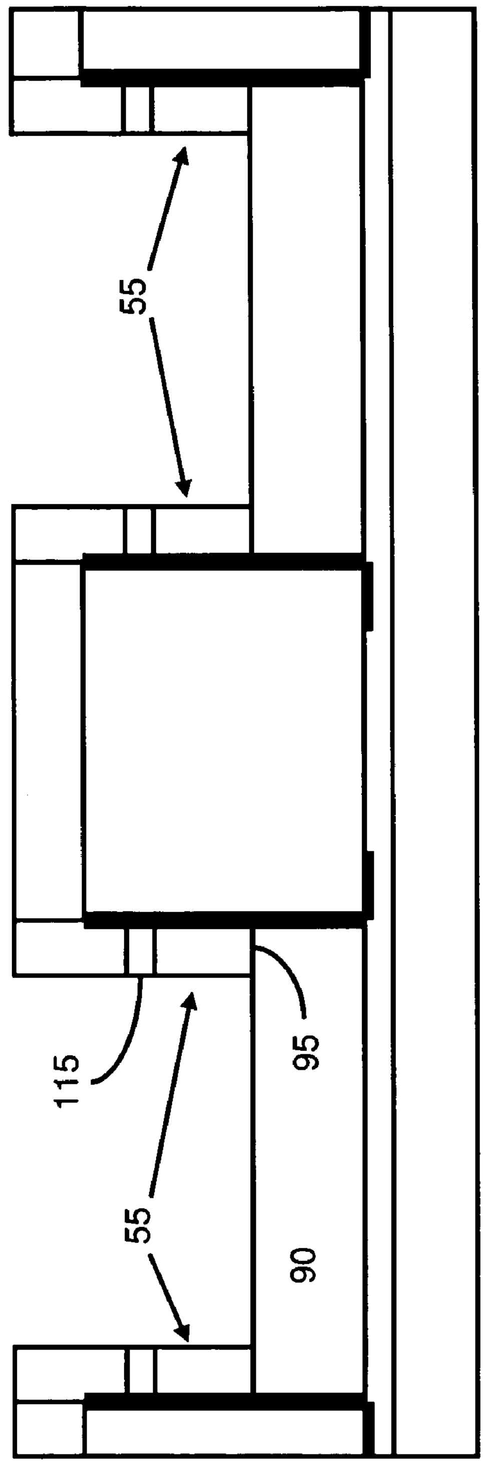
Figure 21:
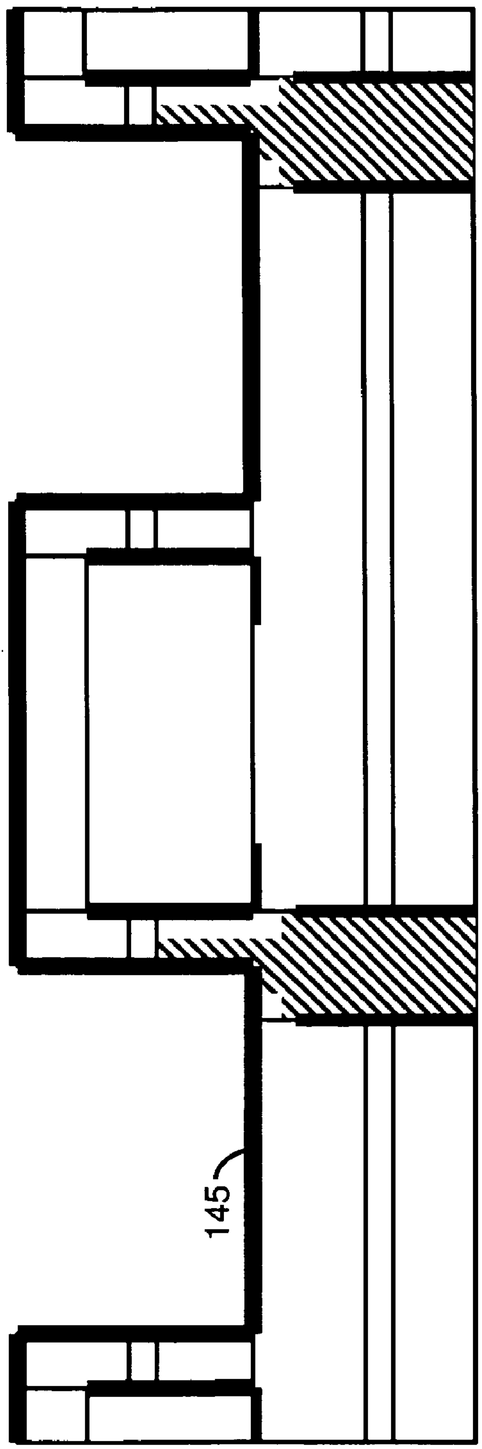
Figure 22:
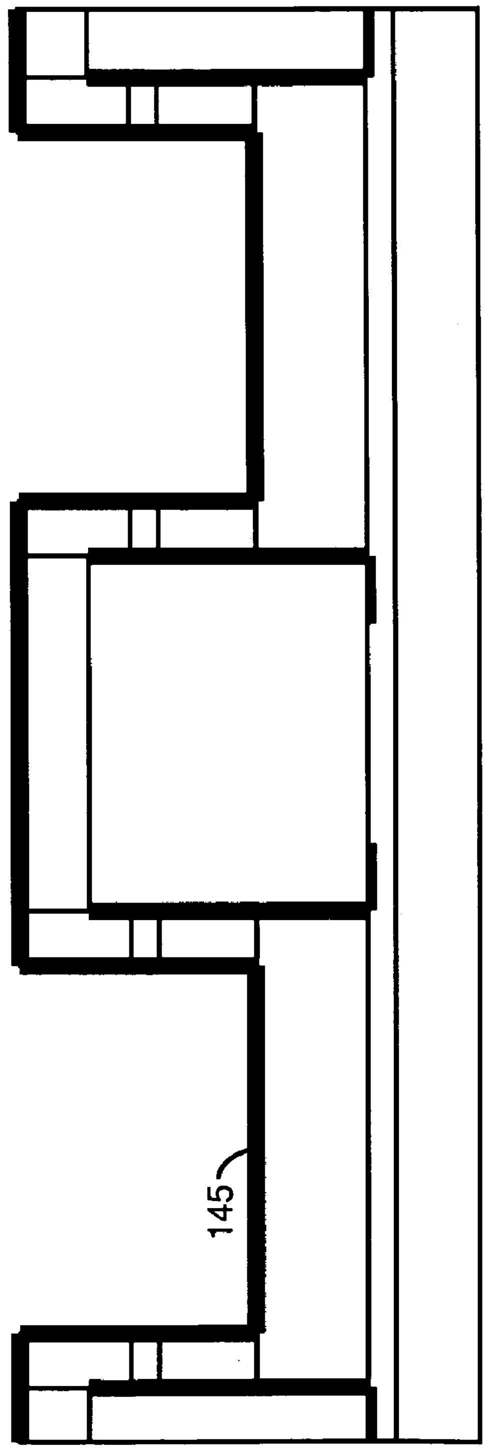

FIGS. 19 and 20 show concurrent intermediate structures along lines B-B and C-C of FIG. 1, respectively. As depicted in FIGS. 19 and 20, portions of the pad film 115 and active silicon 95 are removed to form the fins 55. For example, a first hard mask etch may be followed by a second silicon etch that removes any exposed silicon down to the BOX layer 90. Then, as depicted in FIGS. 21 and 22, which show concurrent intermediate structures along lines B-B and C-C of FIG. 1, respectively, a word-line gate dielectric 145 is formed on all exposed surfaces. In embodiments, the word-line gate dielectric 145 includes hafnium oxide, hafnium silicate, etc., although any suitable material may be used.

Figure 23:
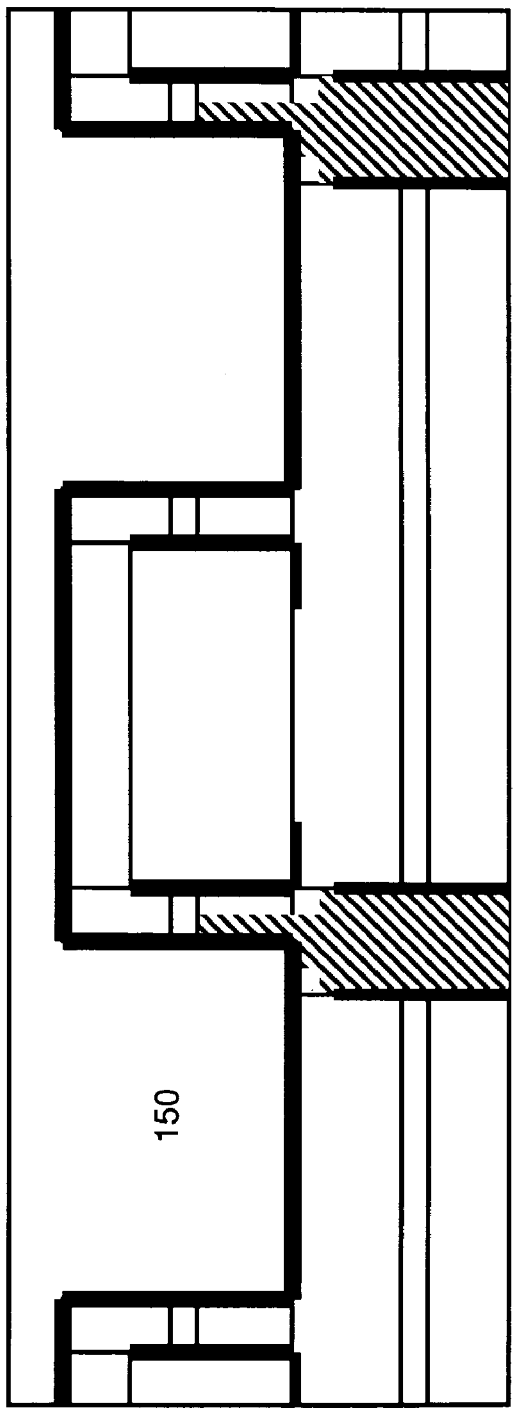
Figure 24:
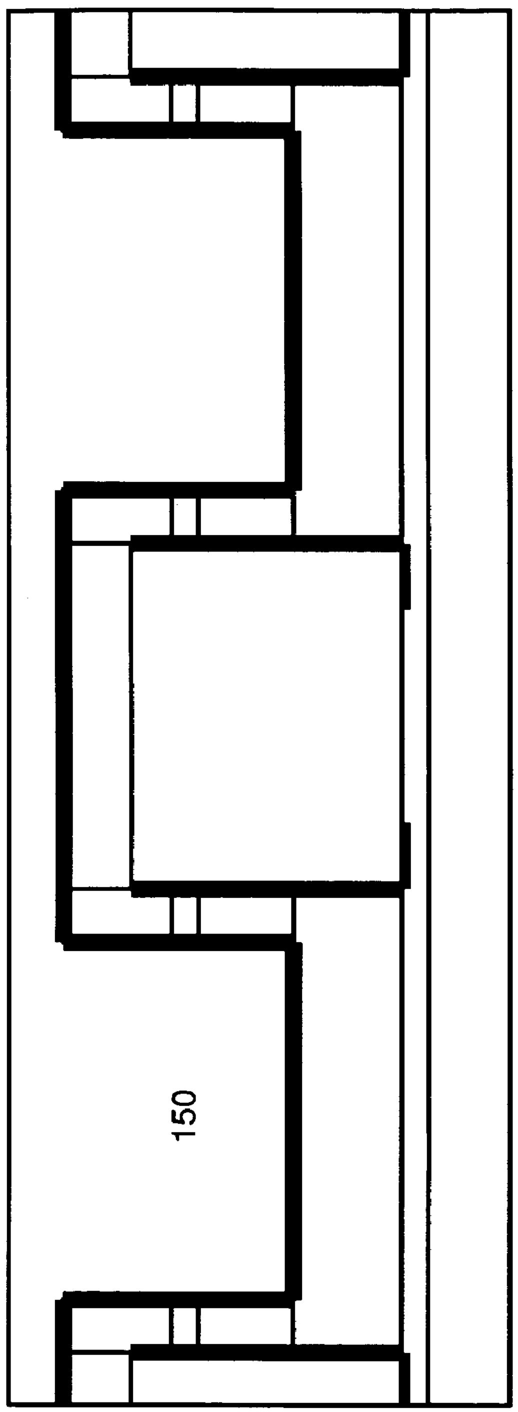

Subsequently, as depicted in FIGS. 23 and 24, which show concurrent intermediate structures along lines B-B and C-C of FIG. 1, respectively, a word-line gate electrode material 150 is formed on all exposed surfaces. In embodiments, the word-line gate electrode material 150 is composed of any suitable conductor, including, but not limited to: titanium nitride, tungsten, doped polysilicon, etc.

Figure 25:
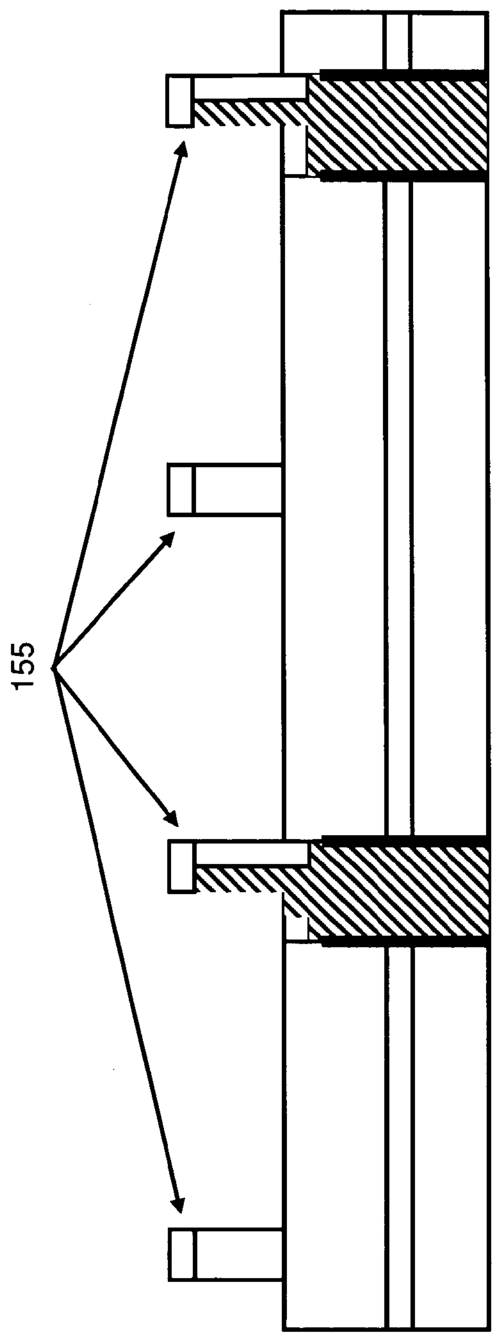
Figure 26:
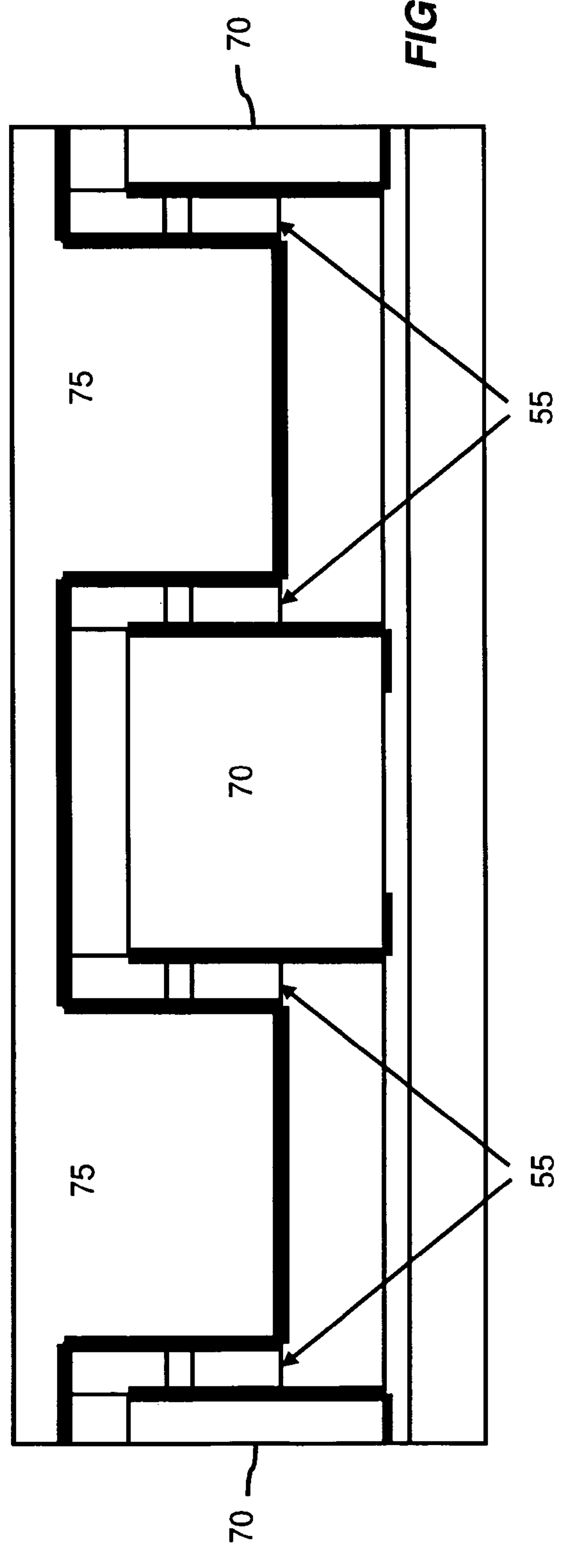

FIGS. 25 and 26 show concurrent intermediate structures along lines B-B and C-C of FIG. 1, respectively. As depicted in FIG. 25, the word-line gate electrode, word line gate dielectric, spacers, insulator, back-gate electrode material, and back-gate dielectric are removed in the region of the capacitors and bit line contacts. The removal of this material may be performed using conventional techniques, such as patterning and etching, and results in interleaved contacts 155 for the capacitor 60 and the bit line contact (not yet formed). The patterning, as depicted in FIG. 26, results in formation of the word line 75 and back-gate 70 on either side of each fin 55. After the patterning, the portions of the fins 55 that will serve as the source and drain for each respective FinFET device may be doped using conventional techniques, such as masking and ion-implantation of suitable ions.

Figure 27:
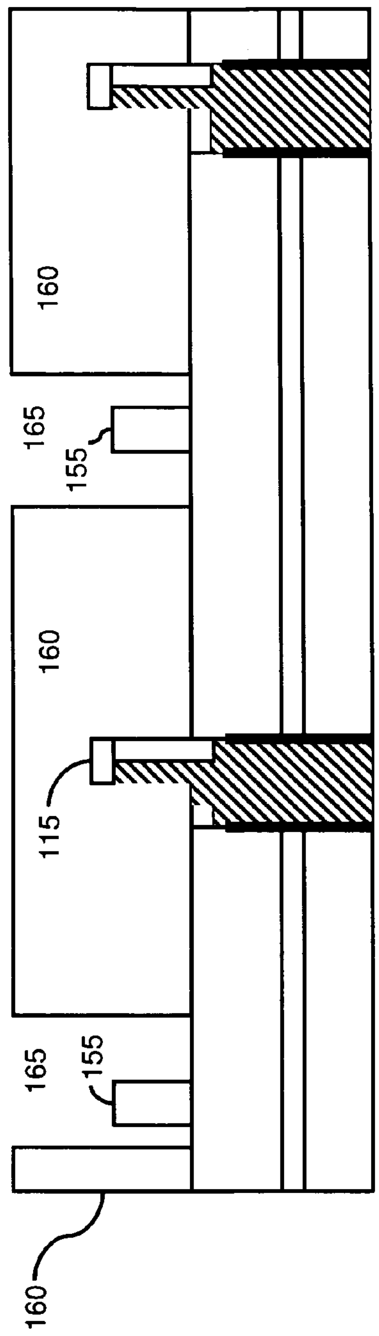
Figure 28:
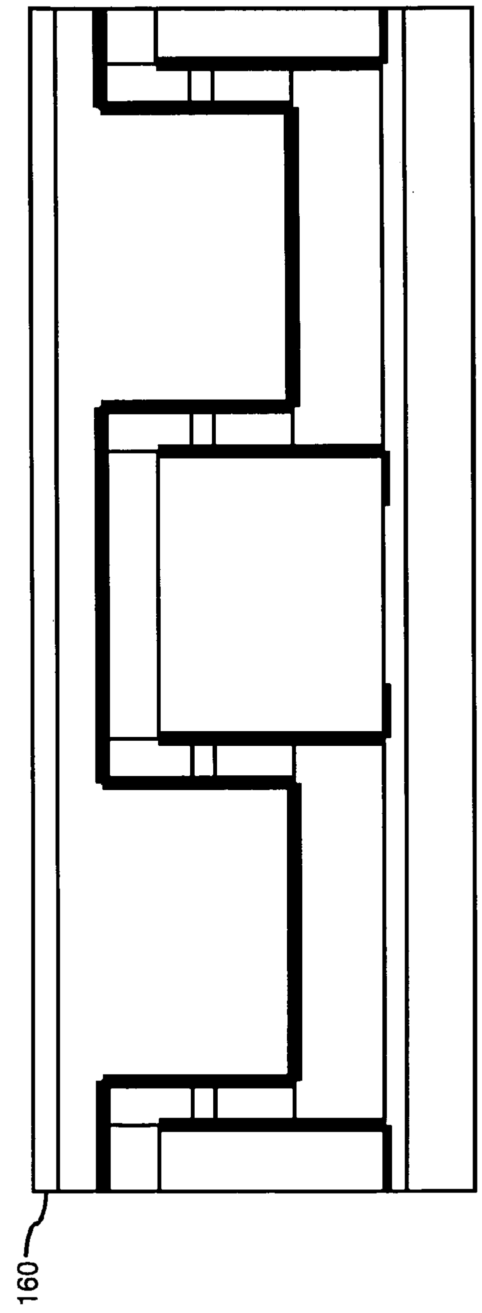

FIGS. 27 and 28 show concurrent intermediate structures along lines B-B and C-C of FIG. 1, respectively. In embodiments, a layer of dielectric material 160 (e.g., $SiO_2$) is formed over all exposed surfaces of the structure. Then, a first patterned etch is performed to produce trenches 165 around the contacts 155 for the bit line contacts, and a second etch is performed to remove the cap (e.g., second pad film 115) from the top of the contacts 155 inside the trenches 165.

Figure 29:
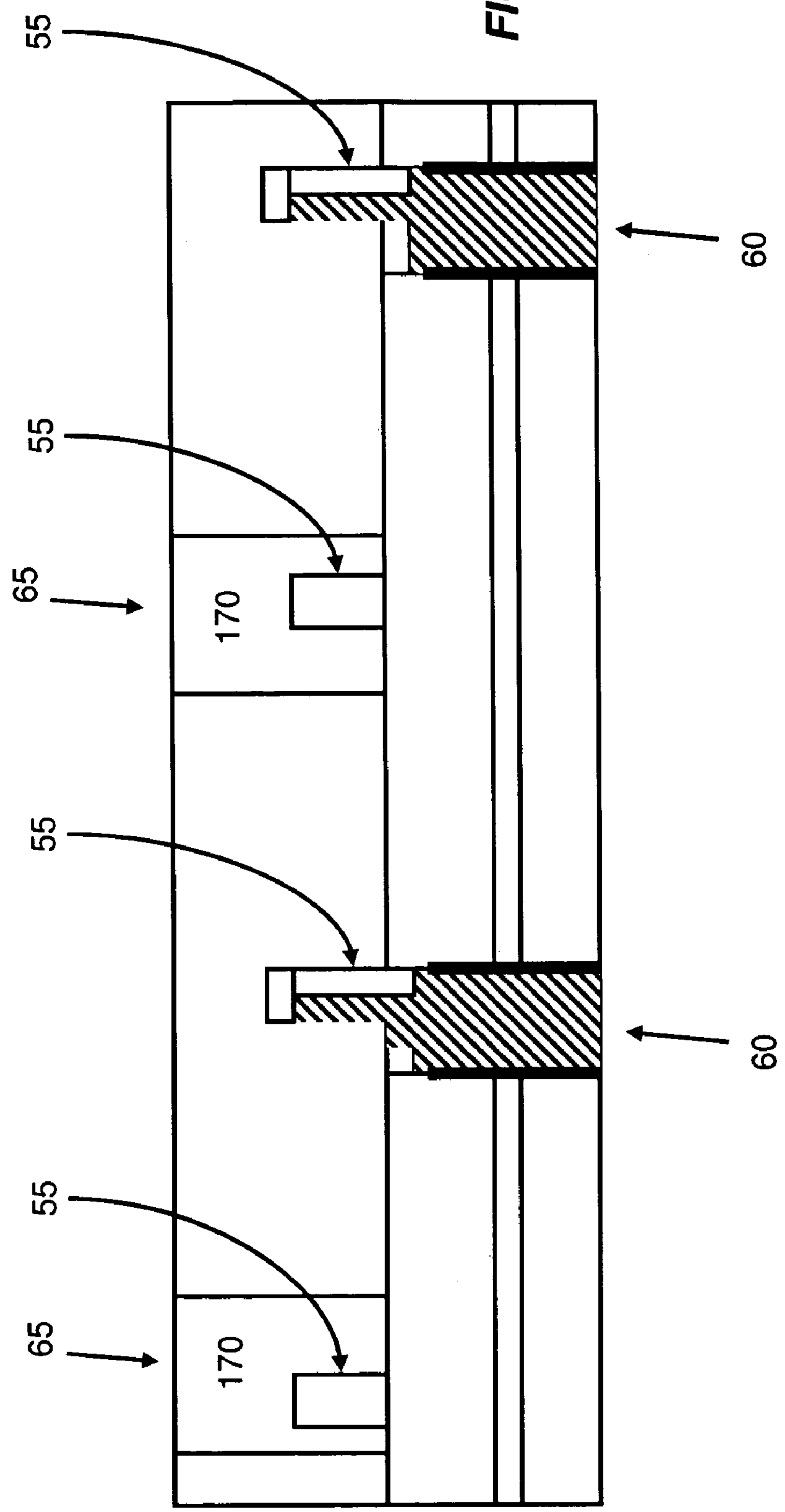

As shown in FIG. 29, which depicts an intermediate structure along line B-B of FIG. 1, the trenches are filled with a conductor 170, such as, for example, doped polysilicon, copper, tungsten, etc. The result is a structure having interleaved bit line contacts 65 and capacitors 60, each associated with a respective fin 55. At this point, conventional back end of line (BEOL) processing techniques may be used to finish the array. For example, conventional interconnect processes may be used to providing wiring that completes the array. Although an array having four devices has been described thusfar, the invention is not limited to this number of devices, and any suitable number of devices can be used in an array in accordance with aspects of the invention.

Figure 30:
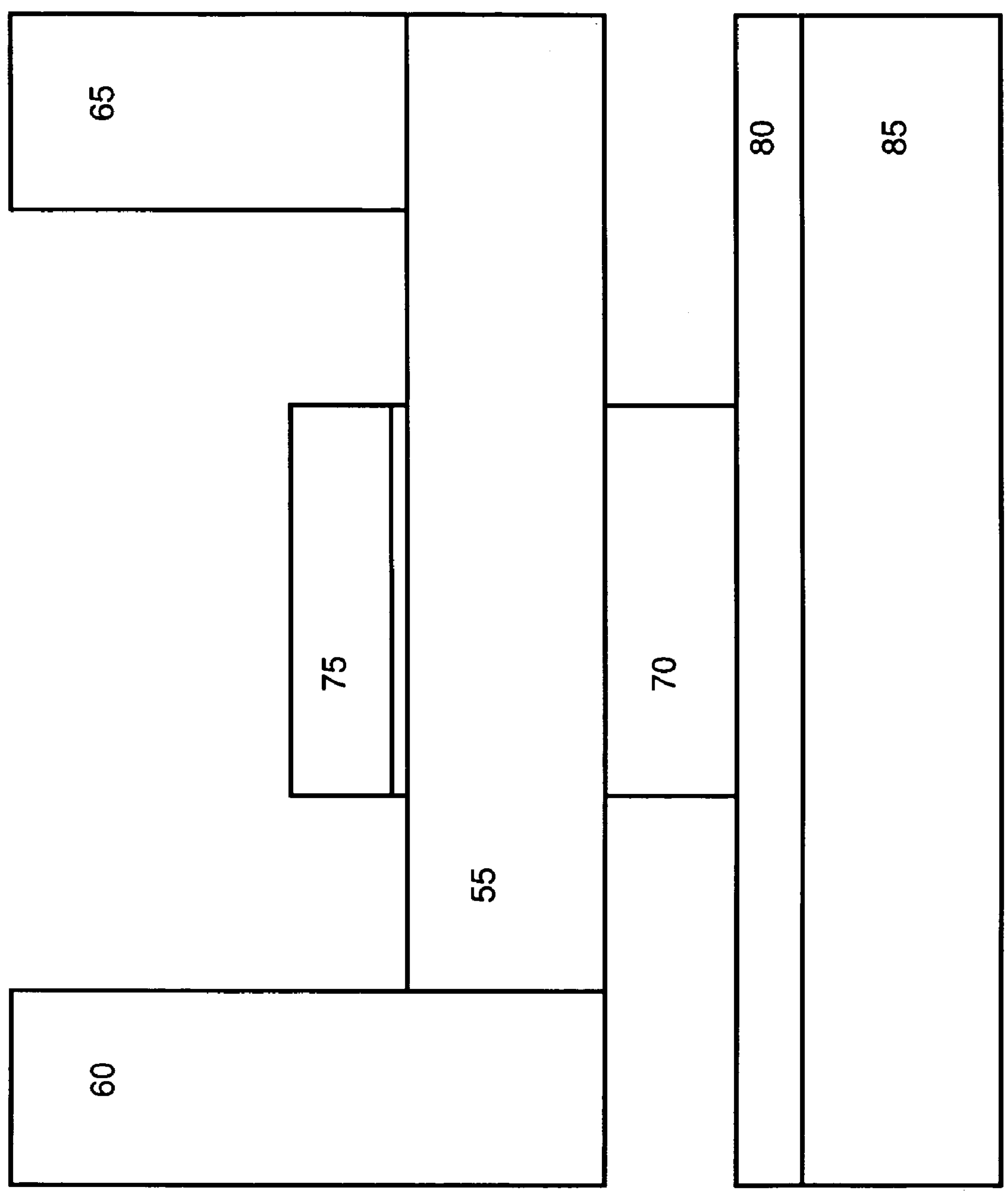
FIG. 30 shows a cross-sectional view of another configuration of a DRAM device according to aspects of the invention.

FIG. 30 shows an alternative configuration similar to the structure shown in FIG. 2, except that in FIG. 30 the capacitor 60 extends upward from the fin 55. The structure depicted in FIG. 30 includes a back-gate 70 in contact with a conductive layer 80 formed on a top surface of a doped region 85 of a substrate, and can be used in an interleaved array, such as that shown in FIG. 1. The structure in FIG. 30 also includes a word line 75 for reading from and/or writing to the capacitor 60. The structure of FIG. 30 may be employed in an interleaved array, such as that shown in FIG. 1, as described in greater detail herein.

Figure 31:
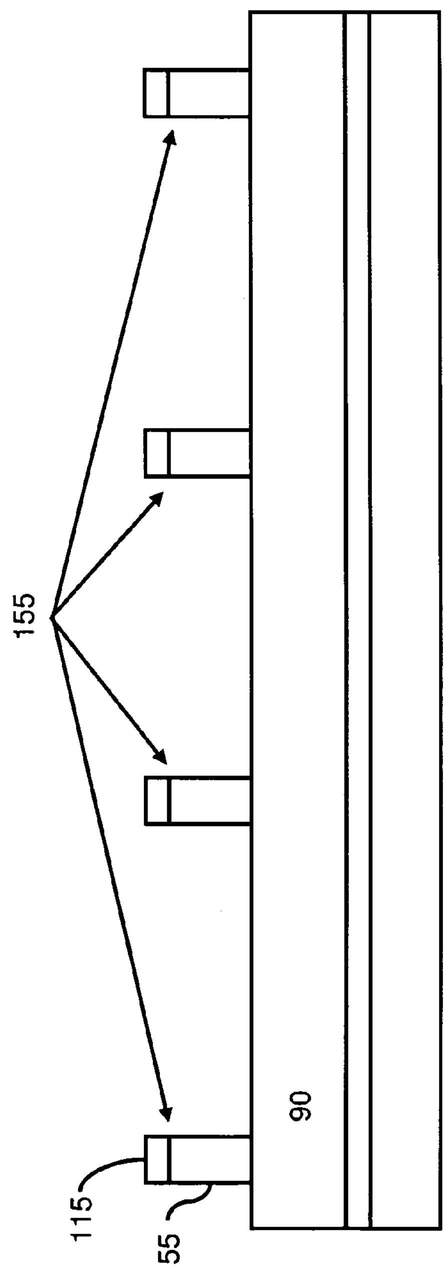
FIGS. 31-38 show fabrication processes and respective structures for manufacturing a structure in accordance with aspects of the invention.
Figure 32:
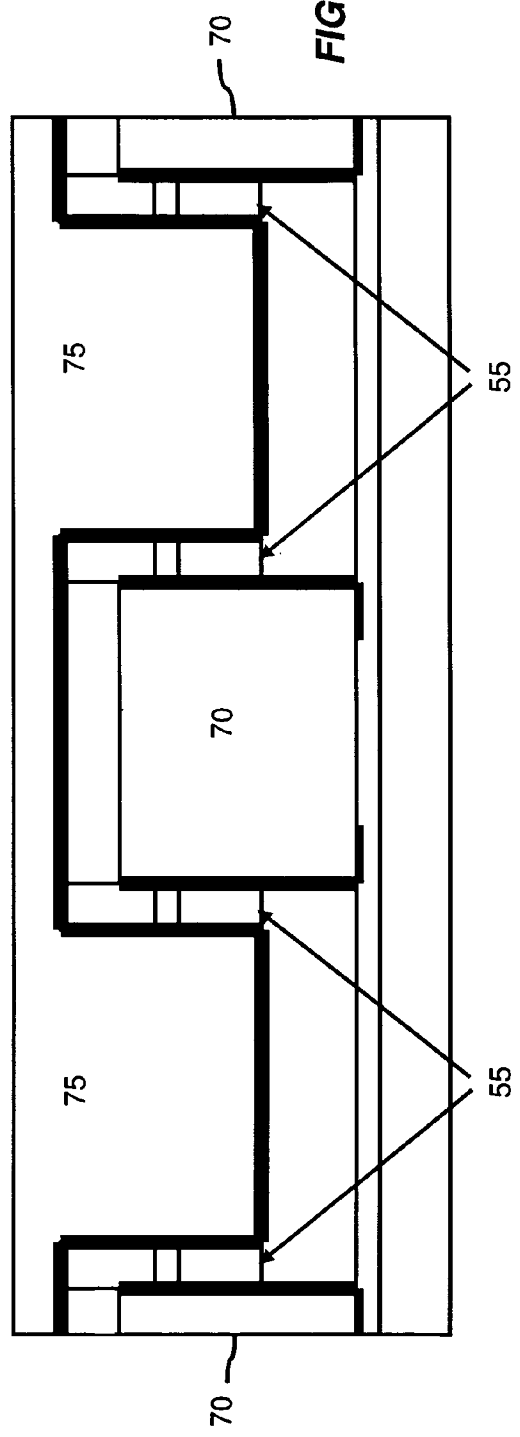

FIGS. 31-38 show fabrication processes and respective structures for manufacturing a structure in accordance with the present invention. Particularly, FIGS. 31 and 32 show concurrent intermediate structures along lines B-B and C-C of FIG. 1, respectively, based upon the structure depicted in FIG. 30. The structures shown in FIGS. 31 and 32 may be arrived at using the same processing steps as described above with respect to FIGS. 3-26, excluding the formation of the capacitors described with respect to FIG. 4. Accordingly, FIG. 31 shows a number of contacts 155 formed on a top surface of the BOX layer 90, for example, at the line B-B of FIG. 1. Each contact 155 comprises a portion of a fin 55 and a cap composed of second pad film 115. Similarly, FIG. 32 depicts the gate region along line C-C of FIG. 1, and shows fins 55 that correspond to the fins 55 described above with respect to FIG. 31. Also shown in FIG. 32 are back-gates 70 and word lines 75.

Figure 33:
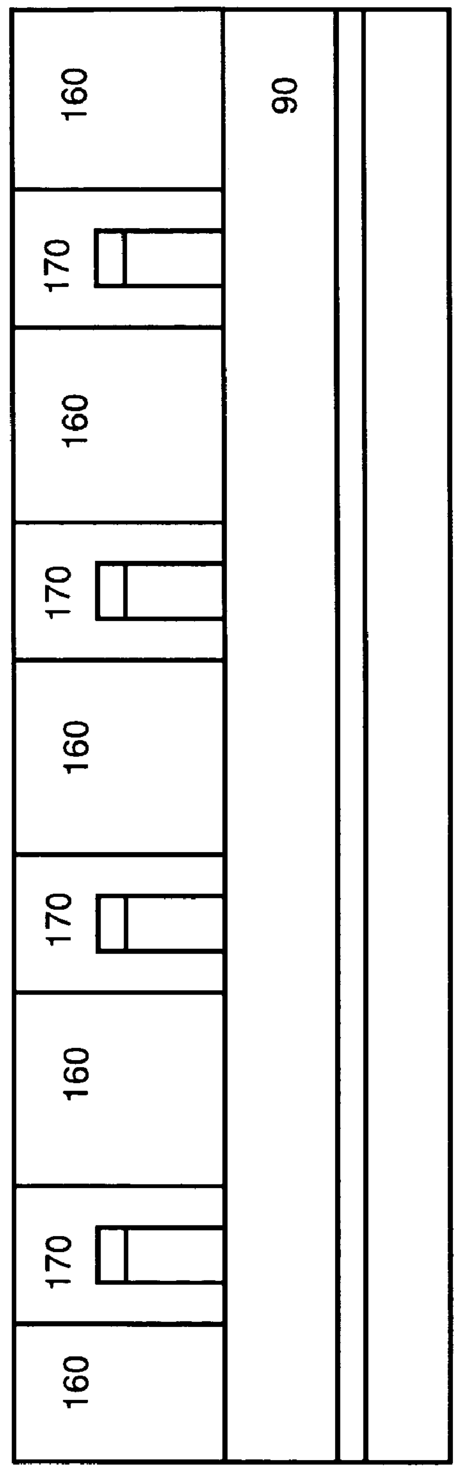

As depicted in FIG. 33, a layer of dielectric material 160 is formed on the exposed surfaces, including the BOX layer 90. Trenches are formed in the dielectric material 160 and filled with a conductor 170. In embodiments, the dielectric material 160 comprises $SiO_2$, and the conductor 170 comprises doped polysilicon, copper, tungsten, etc. However, the invention is not limited to these materials, and any suitable materials may be used.

Figure 34:
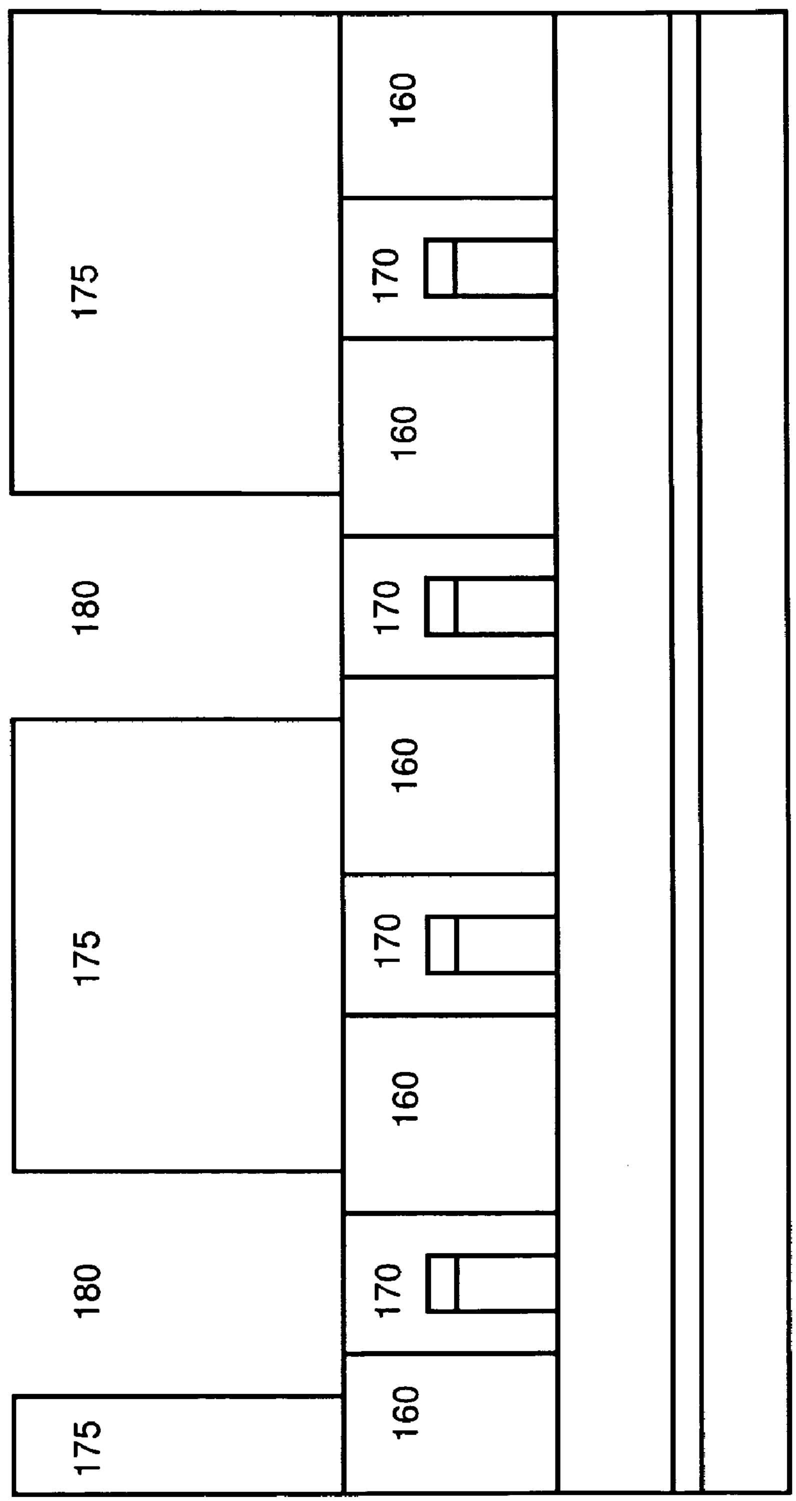

As depicted in FIG. 34, a second layer of dielectric material 175 is deposited on all exposed surfaces (e.g., the dielectric material and conductor 170). The second layer of dielectric material 175 may comprise any suitable material, such as, for example, $SiO_2$. Trenches 180, which will hold the storage capacitors (not yet formed), are created in the second layer of dielectric material 175, using, for example, conventional patterning and etching techniques.

Figure 35:
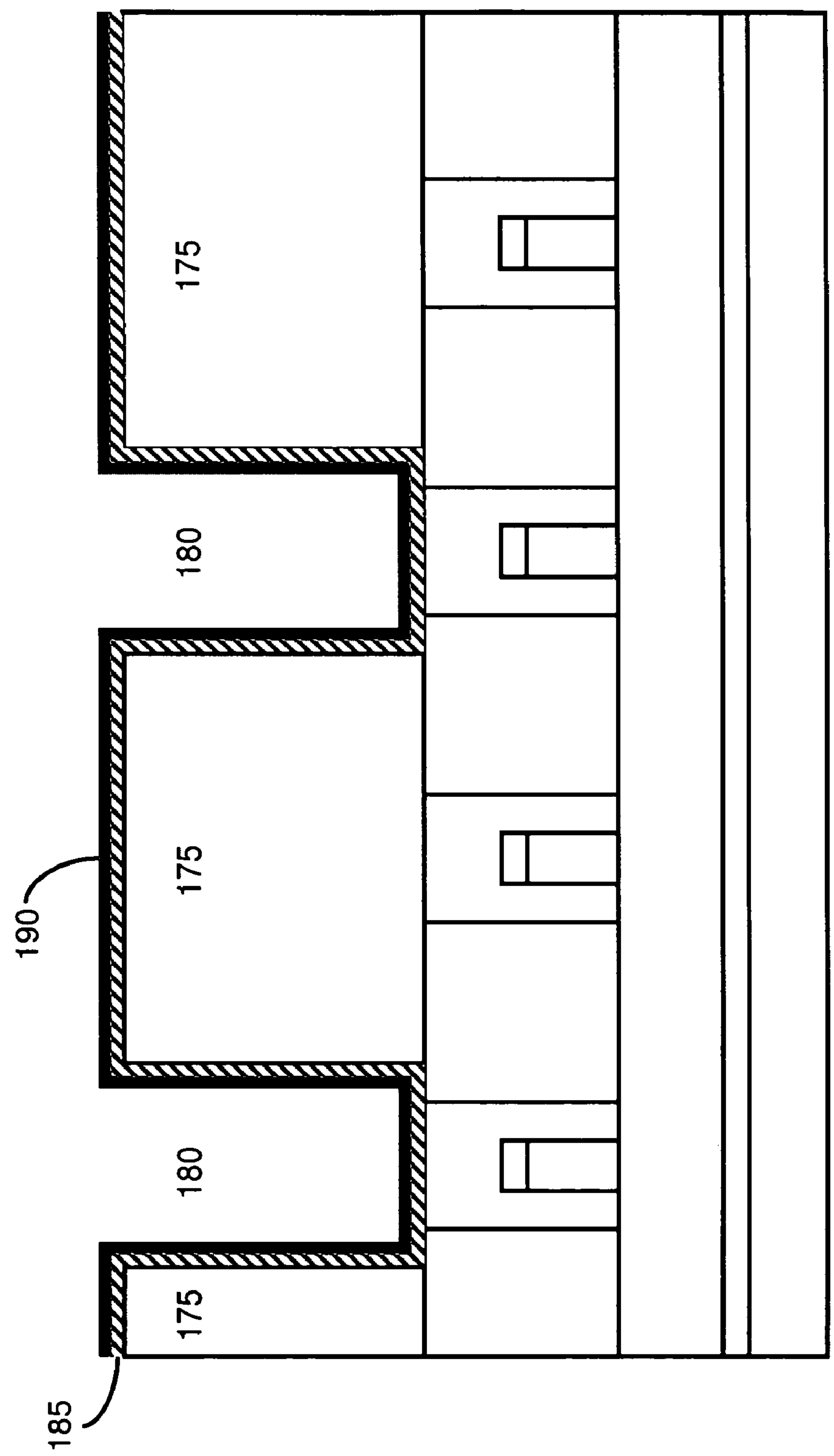

As depicted in FIG. 35, a conductive liner 185 is conformally deposited on the exposed surfaces of the second layer of dielectric material 175, including inside the trenches 180. The conductive liner 185 may be composed of, but is not limited to, titanium nitride, tantalum nitride, etc. Subsequently, a storage dielectric material 190 is deposited on the conductive liner 185. In embodiments, the storage dielectric material 190 is composed of high-k dielectric, such as hafnium silicate, although other suitable materials may be used.

Figure 36:
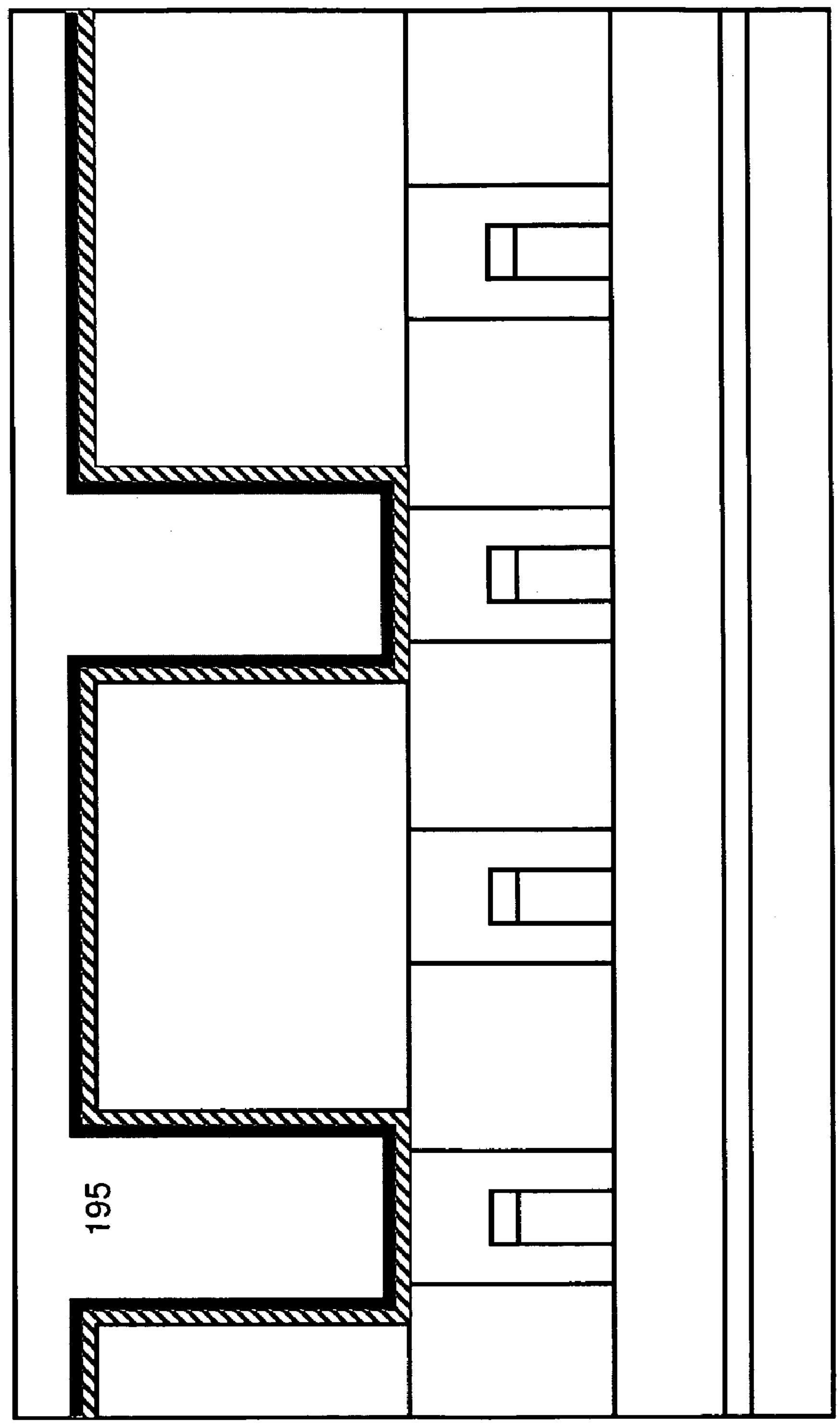
Figure 37:
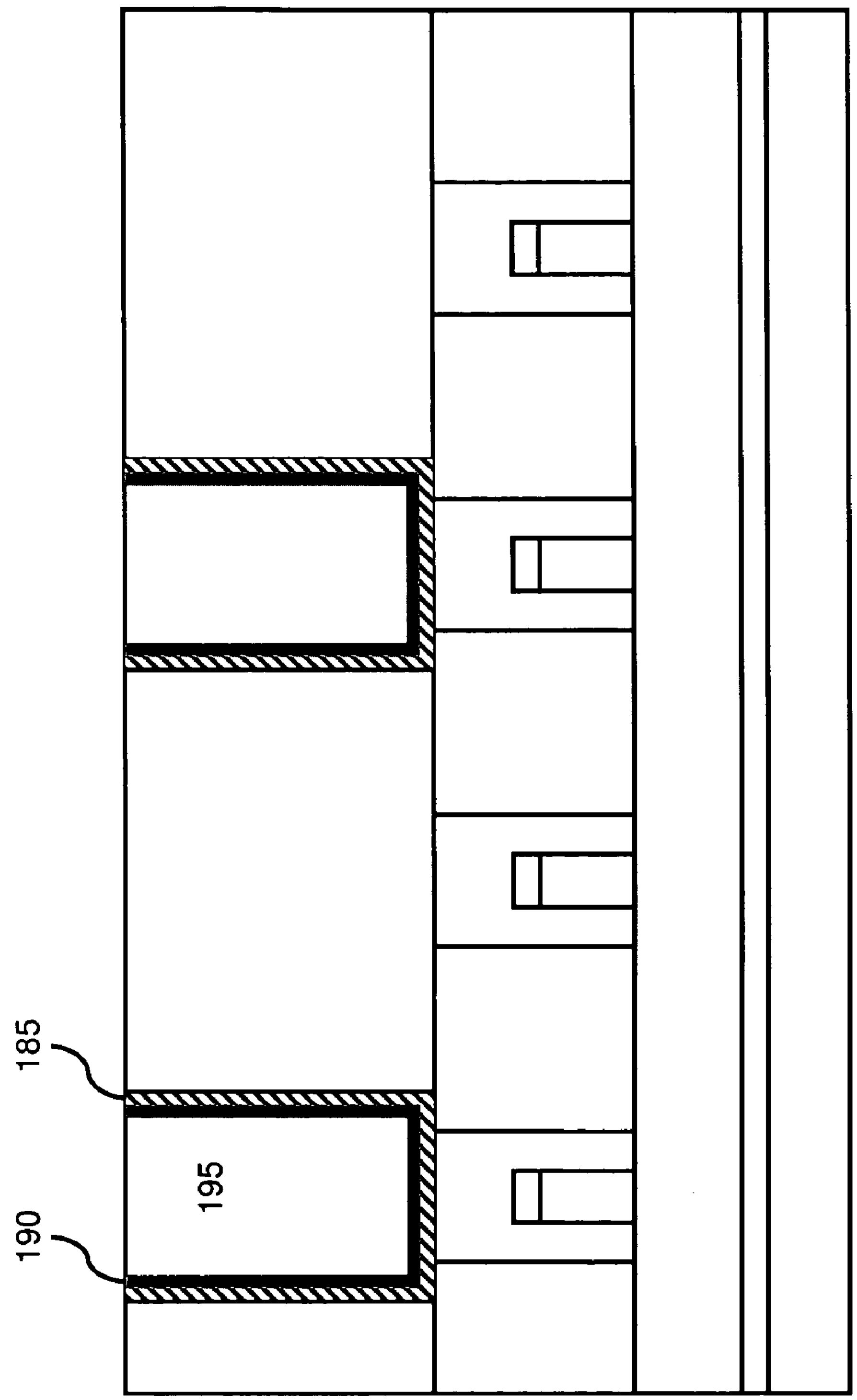

As depicted in FIG. 36, a trench conductor 195 is deposited on exposed surfaces. The trench conductor 195 may comprise, but is not limited to, a liner of titanium nitride or tantalum nitride with tungsten or doped polysilicon fill. Then, as shown in FIG. 37, the structure is planarized, e.g., using a CMP process, thereby removing portions of the conductive liner 185, the storage dielectric material 190, and the trench conductor 195.

Figure 38:
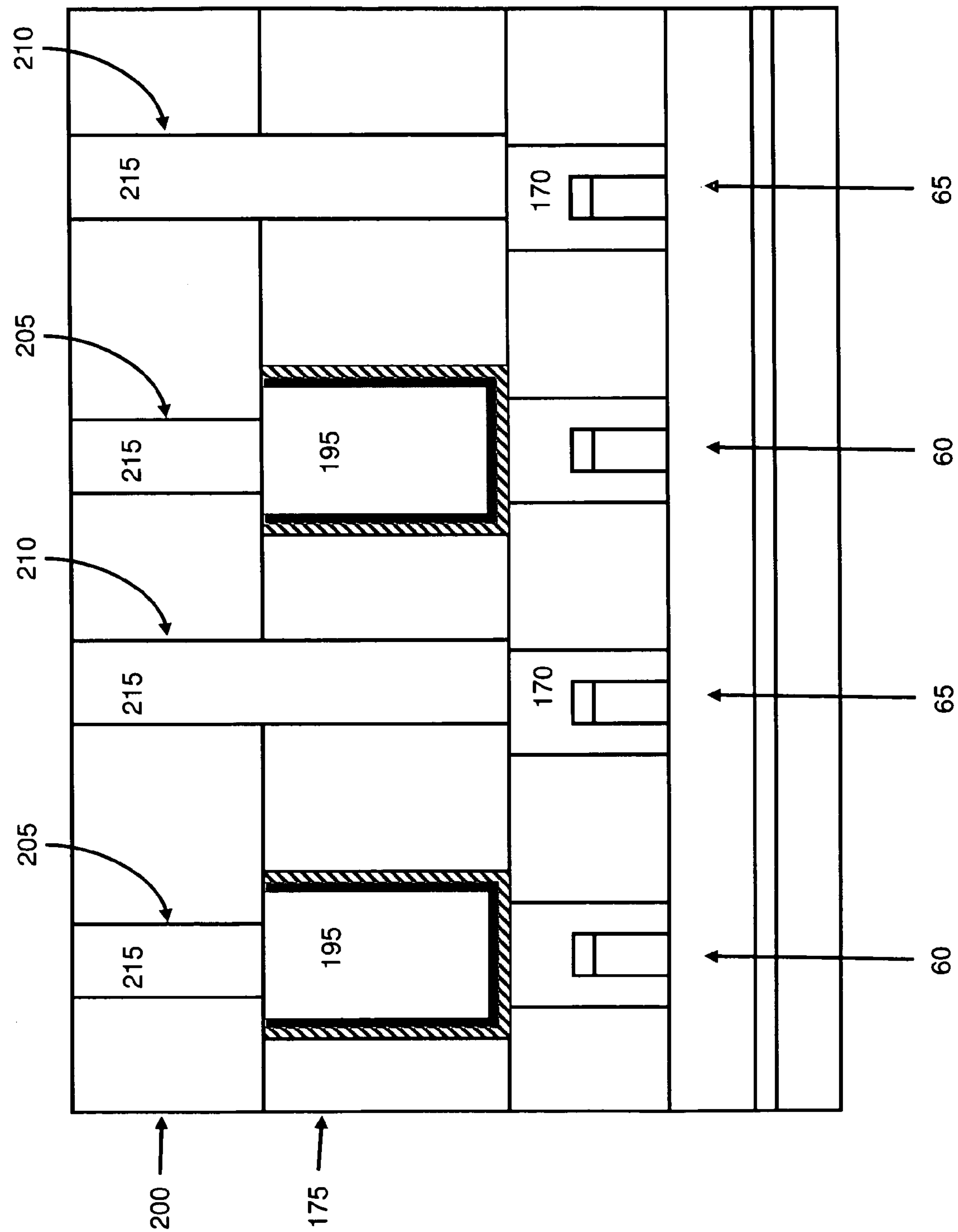

FIG. 38 shows a third dielectric layer 200 formed on a top surface of the second dielectric layer 175. Trenches 205 are formed through the third dielectric layer 200, down to the trench conductor 195. Trenches 210 are formed through the third dielectric layer 200 and the second dielectric layer 175, down to the conductor 170. The trenches 205 and 210 are filled with any suitable conductor 215, thereby forming interleaved capacitors 60 and bit line contacts 65. At this point, conventional back end of line (BEOL) processing techniques may be used to finish the array. For example, conventional interconnect processes may be used to providing wiring that completes the array. Although an array having four devices has been described thusfar, the invention is not limited to this number of devices, and any suitable number of devices can be used in an array in accordance with aspects of the invention.

Figure 39:
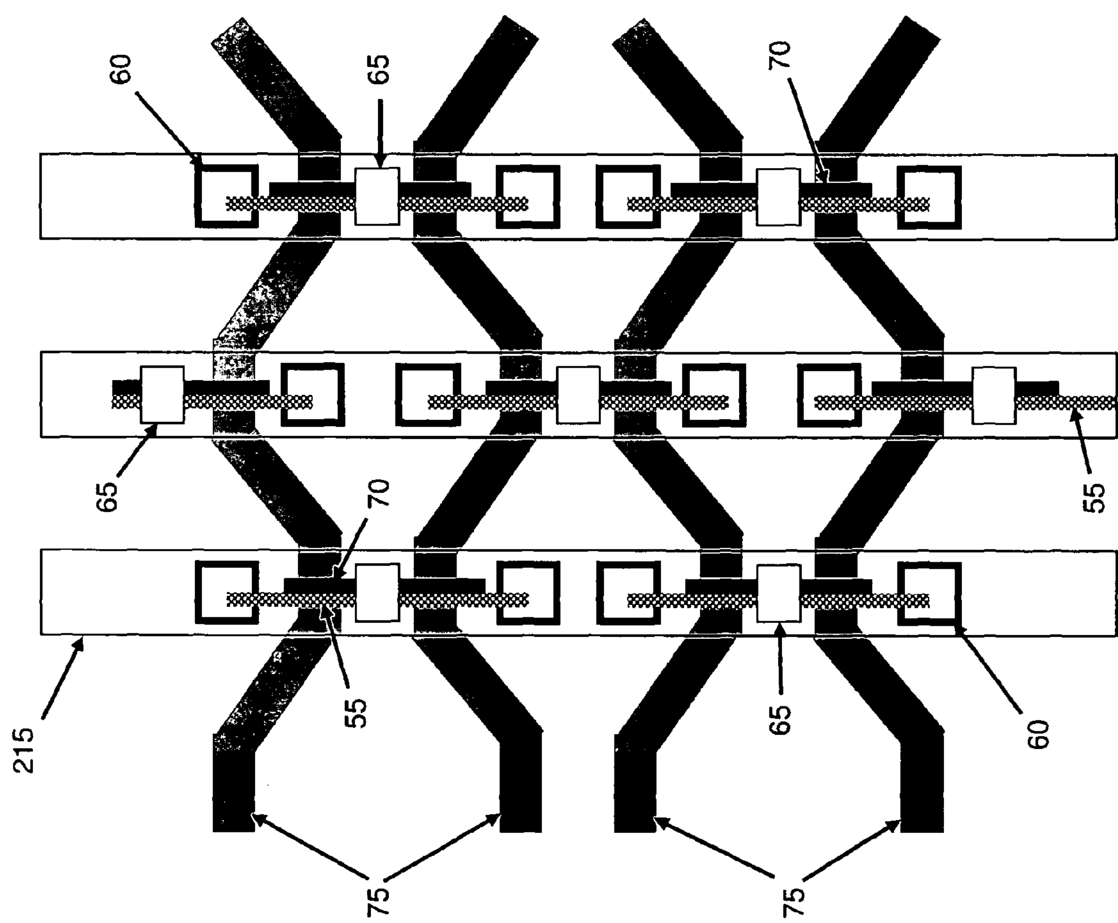
FIG. 39 shows a cross-sectional plan view of portions of another arrangement of an interleaved array of DRAM devices according to aspects of the invention.

FIG. 39 shows an alternative configuration of an interleaved array of DRAM devices according to aspects of the invention. The array includes fins 55, word lines 75, back-gates 70, bit line contacts 65, and storage capacitors 60, either formed downward from the fin 55 (e.g., as shown in FIG. 2) or formed upward from the fin 55 (e.g., as shown in FIG. 30). Wires 215 connected to the bit line contacts 65 may also be employed.

Design Structure

Figure 40:
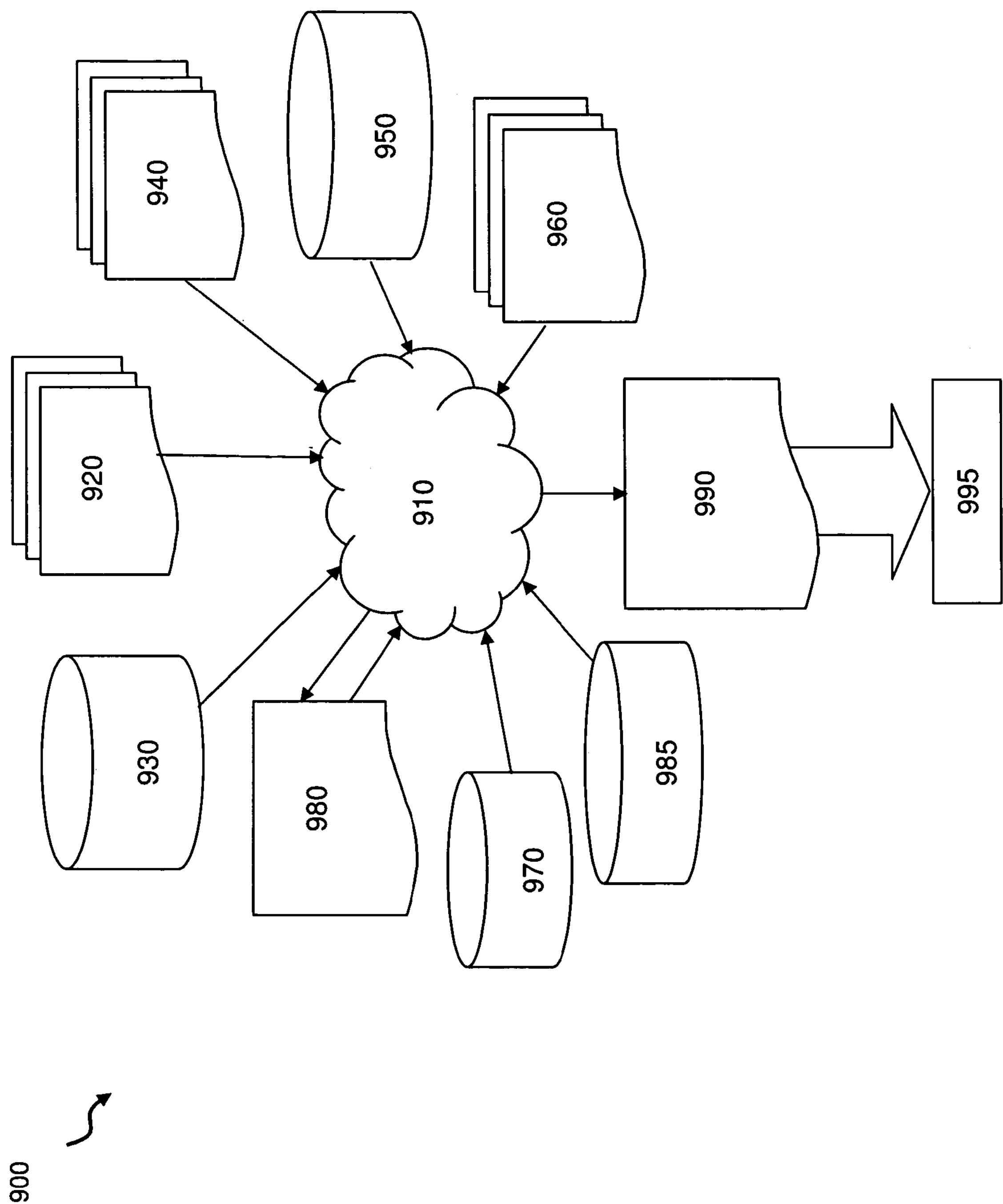
FIG. 40 is a flow diagram of a design process used in semiconductor design, manufacture, and/or test.

FIG. 40 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1-39. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 40 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-39. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-39 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-39. In one embodiment, design structure 990 may comprise a compiled, executable HDL simulation model that functionally simulates the devices shown in FIGS. 1-39.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-39. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of manufacturing a dynamic random access memory cell, comprising:

forming a substrate having an insulating region over a conductive region;

forming a fin of a fin-type field effect transistor (FinFET) device over the insulating region;

forming a storage capacitor at a first end of the fin; and forming a back-gate at a lateral side of the fin, wherein the back-gate is in electrical contact with the conductive region and is structured and arranged to influence a threshold voltage of the fin.

2. The method of claim 1, wherein:

the conductive region is formed over a doped region, the conductive region is doped as a first type, and the doped region is doped as a second type opposite the first type.

3. The method of claim 1, wherein the storage capacitor is formed in a trench formed in the substrate.

4. The method of claim 1, wherein the storage capacitor is formed in a trench formed above the fin.

5. A method of manufacturing a dynamic random access memory cell, comprising:

forming a doped region within a substrate;

forming a conductive layer over the doped region;

forming an insulating layer over the conductive layer;

forming a fin over the insulating region;

forming a storage capacitor connected to a first end of the fin;

forming a bit line contact connected to a second end of the fin opposite the first end;

forming a back-gate at a first lateral side of the fin between the first end and the second end, wherein the back-gate is in electrical contact with the conductive layer; and forming a front gate at a second lateral side of the fin opposite the first lateral side.

6. The method of claim 5, wherein the conductive layer and the doped region are doped with opposite type dopants.

7. The method of claim 5, wherein the storage capacitor extends downward from the fin.

8. The method of claim 7, wherein the storage capacitor comprises a filled trench extending through the conductive layer and into the doped region.

9. The method of claim 5, wherein the storage capacitor extends upward from the fin.

10. The method of claim 9, wherein the storage capacitor comprises a filled trench extending into a dielectric layer formed above the fin.

11. The method of claim 5, wherein the front gate comprises a word line.

12. The method of claim 5, wherein the conductive region is structured and arranged to influence a threshold voltage of the fin between a first threshold voltage and a second threshold voltage.

13. The method of claim 12, wherein:

the first threshold voltage is a standby mode voltage, and the second threshold voltage is an access mode voltage.

14. A method of forming an array of dynamic random access memory cells, comprising:

forming a plurality of fins over a conductive region of a substrate;

for each one of the plurality of fins, forming:

a storage capacitor connected to a first longitudinal end of the fin;

a back-gate adjacent at a first lateral side of the fin, wherein the back-gate is in electrical contact with the conductive region; and a front gate at a second lateral side of the fin opposite the first lateral side.

15. The method of claim 14, further comprising forming, for each one of the plurality of fins, a bit line contact at a second longitudinal end of the fin opposite the first longitudinal end.

16. The method of claim 15, wherein the conductive region is structured and arranged to influence a threshold voltage in each one of the plurality of fins.

17. The method of claim 14, wherein the plurality of fins are interleaved.

18. A method of forming an array of dynamic random access memory cells, comprising:

forming, in a substrate, a doped region having a first type of dopant;

forming, in the substrate and over the doped region, a conductive region having a second type of dopant opposite the first type of dopant;

forming a plurality of fin-type field effect transistor (FinFET) devices, wherein each one of the plurality of FinFET devices comprises:

a fin formed over the conductive region of a substrate;

a storage capacitor connected to a longitudinal end of the fin;

a back-gate adjacent at a first lateral side of the fin, wherein the back-gate is in electrical contact with the conductive region; and a front gate at a second lateral side of the fin opposite the first lateral side.

19. The method of claim 18, wherein the plurality of FinFET devices form an interleaved array.

20. The method of claim 18, wherein the conductive region is structured and arranged to influence a threshold voltage in each one of the plurality of FinFET devices.

* * * * *